(12) United States Patent
Parrella, Sr. et al.

(10) Patent No.: US 7,260,651 B2
(45) Date of Patent: Aug. 21, 2007

(54) SYSTEM AND METHOD FOR INCREASING THE EFFECTIVE BANDWIDTH OF A COMMUNICATIONS NETWORK

(75) Inventors: Michael J. Parrella, Sr., Weston, CT (US); John Lash, Wilton, CT (US); Jerry M. Metcoff, Roxbury, CT (US); Michael J. Parrella, Jr., Fairfield, CT (US); Cheryl Bray, Willington, CT (US); Ed Lau, Middletown, CT (US)

(73) Assignee: NCT Group, Inc., Shelton, CT (US)

( * ) Notice: Subject to any disclaimer, the term of this patent is extended or adjusted under 35 U.S.C. 154(b) by 695 days.

(21) Appl. No.: 10/164,034

(22) Filed: Jun. 4, 2002

(65) Prior Publication Data

US 2003/0079041 A1    Apr. 24, 2003

Related U.S. Application Data

(60) Provisional application No. 60/295,721, filed on Jun. 4, 2001, provisional application No. 60/295,672, filed on Jun. 4, 2001, provisional application No. 60/295,676, filed on Jun. 4, 2001, provisional application No. 60/295,720, filed on Jun. 4, 2001, provisional application No. 60/295,671, filed on Jun. 4, 2001.

(51) Int. Cl.
*G06F 15/16* (2006.01)
(52) U.S. Cl. .......................... 709/247; 709/226
(58) Field of Classification Search ............... 726/15; 709/247, 200–203, 217–227
See application file for complete search history.

(56) References Cited

U.S. PATENT DOCUMENTS

| | | |
|---|---|---|
| 5,467,087 A | 11/1995 | Chu |
| 5,918,013 A | 6/1999 | Mighdoll et al. |
| 5,938,737 A | 8/1999 | Smallcomb |
| 5,964,842 A | 10/1999 | Pakard |
| 6,012,085 A | 1/2000 | Yohe et al. |
| 6,049,821 A | 4/2000 | Theriault et al. |

(Continued)

FOREIGN PATENT DOCUMENTS

EP    1 104 141 A    5/2001

(Continued)

OTHER PUBLICATIONS

Fielding et al. RFC 2616: HTTP/1.1. IETF. Jun. 1999. pp. 29-33.*

(Continued)

*Primary Examiner*—Moustafa M. Meky
(74) *Attorney, Agent, or Firm*—Thelen, Reid et al.

(57) ABSTRACT

A system and method for increasing the effective bandwidth of a communications network is provided by overlaying a "super" transport and caching structure over the conventional TCP/IP communications network, for example, the Internet, which increases the transfer rate of information in the communications network. The "super" transport and caching structure includes software or hardware or both added to at least two modules separated by a communications link in the communications network. The net result is that the users of the communications network have their time to access and/or retrieve information significantly reduced, and the communications network, particularly a large network, e.g., the Internet, becomes an efficient means of performing commercial transactions by both businesses and individuals.

7 Claims, 18 Drawing Sheets

U.S. PATENT DOCUMENTS

| | | | |
|---|---|---|---|
| 6,122,666 | A | 9/2000 | Buerket et al. |
| 6,128,655 | A | 10/2000 | Fields et al. |
| 6,151,601 | A | 11/2000 | Papierniak et al. |
| 6,167,438 | A | 12/2000 | Yates et al. |
| 6,173,399 | B1 * | 1/2001 | Gilbrech .................... 713/153 |
| 6,185,625 | B1 * | 2/2001 | Tso et al. ................... 709/247 |
| 6,195,358 | B1 | 2/2001 | Bowater et al. |
| 6,240,444 | B1 | 5/2001 | Fin et al. |
| 6,310,892 | B1 | 10/2001 | Olkin |
| 6,404,766 | B1 | 6/2002 | Kitai et al. |
| 6,434,168 | B1 | 8/2002 | Kari |

FOREIGN PATENT DOCUMENTS

| | | |
|---|---|---|
| WO | WO 00/10278 | 2/2000 |
| WO | WO 00/44116 | 7/2000 |
| WO | WO 00/51307 | 8/2000 |
| WO | WO 01/19024 A2 | 3/2001 |

OTHER PUBLICATIONS

System And Method For Reducing The Time to Deliver Information from a Communications Network To a User, Jun. 2002, not assigned.

System And Method For Modifying A Data Stream Using Element Parsing, Jun. 2002, not assigned.

Henrik Frystyk Nielsen, et al. "Network Performance Effects of HTTP/1.1, CSSI, and PNG" http://www.w3.org/Protocols/HTTP/Performance/Pipeline.html (May 31, 2002).

Best Systems A Draytek Distributor "Virtual Private Networking" http://bestsystemsdirect.com/VPN/vpn.html (May 29, 2002).

http://searchwebmanagement.techtarget.com/sDefinition/0,,sid27_gci212291,00.html "HTTP1.1" (May 27, 2002).

"Time-Based Compression Selection Line Detector Methodology", IBM Technical Disclosure Bulletin, vol. 35, No. 6, Nov. 1992.

* cited by examiner

SYSTEM AND METHOD FOR INCREASING THE EFFECTIVE BANDWIDTH OF A COMMUNICATIONS NETWORK

CROSS REFERENCES

The following copending, commonly assigned applications are incorporated herein by reference in their entirety: U.S. Utility Application entitled, "System And Method For Reducing The Time To Deliver Information From a Communications Network To a User", by Michael J. Parrella, Sr., et al., filed Jun. 4, 2002, Ser. No. 10/164,261; and U.S. Utility Application entitled, "System and Method For Modifying a Data Stream Using Element Parsing", by Michael J. Parrella, Sr., et al., filed Jun. 4, 2002, Ser. No. 10/164,296.

This application claims priority from and incorporates by reference in its entirety U.S. Provisional Application Ser. No. 60/295,721, titled "System and Method for Improving the Effective Bandwidth of a Communication Device", by Michael J. Parrella et. al., filed Jun. 4, 2001, U.S. Provisional Application Ser. No. 60/295,672, titled "Method and System Providing Compression/Decompression of Communication Data", by Michael J. Parrella et al., filed Jun. 4, 2001, U.S. Provisional Application Ser. No. 60,295,676, titled "System and Method Providing Packaging of Parseable Data Elements in a Network Communication", by Michael J. Parrella et al., filed Jun. 4, 2001, U.S. Provisional Application Ser. No. 60/295,720, titled "Bi-Directional File Transfer Multiplier", by Michael J. Parrella et al., filed Jun. 4, 2001, and U.S. Provisional Application Ser. No. 60/295,671, titled "Modification of a Data Stream Using Element Parsing", by Michael J. Parrella et al., filed Jun. 4, 2001.

FIELD OF THE INVENTION

The invention relates generally to the field of communications, and in particular to the efficient transfer of information over a computer network.

BACKGROUND OF THE INVENTION

The Internet has grown considerably in its scope of use over the past decades from a research network between governments and universities to a means of conducting both personal and commercial transactions by both businesses and individuals. The Internet was originally designed to be unstructured so that in the event of a breakdown the probability of completing a communication was high. The method of transferring information is based on a concept similar to sending letters through the mail. A message may be broken up into multiple TCP/IP packets (i.e., letters) and sent to an addressee. Like letters, each packet may take a different path to get to the addressee. While the many small packets over many paths approach provides relatively inexpensive access by a user to, for example, many Web sites, it is considerably slower than a point-to-point connection between a user and a Web site.

FIG. 1 is a block diagram showing a user connection to the Internet of the prior art. In general a user 110 connects to the Internet via a point-of-presence (PoP) 112 traditionally operated by an Internet Service Provider (ISP). The PoP is connected to the ISP's backbone network 114, e.g., ISP1. Multiple ISP backbone networks, e.g., ISP1 and ISP2, are connected together by Network Access Points, e.g., NAP 170, to form the Internet "cloud" 160.

More specifically, a single user at a personal computer (PC) 120 has several choices to connect to the PoP 112 such as a direct subscriber line (DSL) modem 122, a TV cable modem 124, a standard dial-up modem 126, or a wireless transceiver 128 on, for example, a fixed wireless PC or mobile telephone. The term personal computer or PC is used herein to describe any device with a processor and a memory and is not limited to a traditional desktop PC. At the PoP 112 there will be a corresponding access device for each type of modem (or transceiver) to receive/send the data from/to the user 110. For the DSL modem 122, the PoP 112 has a digital subscriber line access multiplexer (DSLAM) as its access device. For the cable modem 124, the PoP 112 has a cable modem termination system (CTMS) headend as its access device. DSL and cable modem connections allow hundreds of kilo bits per second (Kbps) and are considerably faster than the standard dial up modem 126 whose data is received at the PoP 112 by a dial-up remote access server (RAS) 134. The wireless transceiver 128 could be part of a personal digital assistant (PDA) or mobile telephone and is connected to a wireless transceiver 136, e.g., a base station, at the PoP 112.

A business user (or a person with a home office) may have a local area network (LAN), e.g., PCs' 140 and 142 connected to LAN server 144 by Ethernet links. The business user may have a T1 (1.544 Mbps), a fractional T1 connection or a faster connection to the PoP 112. The data from the LAN server 144 is sent via a router (not shown) to a digital connection device, e.g., a channel service unit/data service unit (CSU/DSU) 146, which in turn sends the digital data via a T1 (or fractional T1) line 148 to a CSU/DSU at the PoP 112.

The PoP 112 may include an ISP server 152 to which the DSLAM 130, CTMS Headend 132, RAS 134, wireless transceiver 136, or CSU/DSU 150, is connected. The ISP server 152 may provide user services such as E-mail, Usenet, or Domain Name Service (DNS). Alternatively, the DSLAM 130, CTMS Headend 132, RAS 134, wireless transceiver 136, or CSU/DSU 150 may bypass the ISP server 152 and are connected directly to the router 154 (dashed lines). The server 152 is connected to a router 154 which connects the PoP 112 to ISP1's backbone having, e.g., routers 162, 164, 166, and 168. ISP1's backbone is connected to another ISP's backbone (ISP 2) having, e.g., routers 172, 174, and 176, via NAP 170. ISP2 has an ISP2 server 180 which offers competing user services, such as E-mail and user Web hosting. Connected to the Internet "cloud" 160 are Web servers 182 and 184, which provide on-line content to user 110.

While the Internet provides the basically functionality to perform commercial transactions for both businesses and individuals, the significant time delay in the transfer of information between, for example, a Web server and a business or individual user is a substantial problem. For example a user at PC 120 wants information from a Web site at Web server 182. There are many "hops" for the data to travel back from Web server 182 to user PC 120. Also because information is being "mailed" back in packets, the packets travel back typically through different paths. These different paths are shared with other users packets and some paths may be slow. Hence there is a significant time delay even if there were sufficient capacity in all the links between Web server 182 and user 120. However, because there are also choke points, i.e., where the traffic exceeds the capacity, there is even further delay.

Two major choke points are the last and second to last mile. The last mile is from the PoP 112 to the user 110. This is readily evident when the user 120 is using a dial up modem with a maximum speed of 56 Kbps. Even with a DSL modem of about 512 Kbps downloading graphics may be unpleasantly slow. The second to last mile is between the ISPs. An ISP with PoP 112 may connect via its backbone 114 to a higher level ISP (not shown) to get regional/national/global coverage. As an increase in bandwidth to the higher level ISP increases the local ISP's costs, the local ISP with, for example PoP 112, may instead reduce the amount of bandwidth available to user 110. The effect is that there is more traffic than link capacity between Web server 182 and PC 120 and hence a significant delay problem. In today's fast pace world this problem is greatly hindering the use of the Internet as a commercial vehicle.

Therefore there is a need for improving the efficiency of the transfer of information over a communications network, e.g., the Internet, such that, either individually or collectively, the user's wait time for information is significantly reduced.

SUMMARY OF THE INVENTION

The present invention provides a system and method for increasing the effective bandwidth of a communications network by overlaying a "super" transport and caching structure over the conventional TCP/IP communications network, for example, the Internet, which increases the transfer rate of information in the communications network.

The "super" transport and caching structure includes software or hardware or both added to at least two modules separated by a communications link in the communications network. Between any two "super" modules a communication link is established which allows fast and efficient transfer of information, where transfer of information is not the same as the number of the raw bits being transferred, but includes only necessary data bits and excludes, for example, overhead control bits or redundant data bits. Since the communications link has a fixed capacity, increasing the information bits and decreasing the non-information bits reduces the amount of sharing of the link's capacity with non-information bits. Hence some of the information bits do not have to wait until some of the non-information bits are transferred first. Thus the transfer delay of information is significantly reduced.

The net result of the "super" transport and caching structure and hence the increased rate of information transfer is that the users of the communications network have their time to access and/or retrieve information significantly reduced, and the communications network, particularly a large network, e.g., the Internet, becomes an efficient means of performing commercial transactions by both businesses and individuals.

One embodiment of the present invention provides a method for compressing data by a first computer system for transfer to a second computer system via a communications network. First, a section of data is selected by the first computer system. Next, a cost value is determined for each compression algorithm of a plurality of compression algorithms using the first computer's system operating conditions. A compression algorithm is selected from the plurality based on a smallest cost value. The section is compressed using the selected compression algorithm, and sent to the second computer system.

Another embodiment of the present invention provides a method for compressing data by a first computer system for transfer to a second computer system via a communications network. The method includes: selecting a section of data by the first computer system; determining a data format of the section; compressing the section using a compression algorithm, where the compression algorithm is automatically selected from a plurality of compression algorithms based on the data format; and sending the compressed section to the second computer.

Yet another embodiment of the present invention provides a method for compressing data by a first computer system for transfer to a second computer system via a communications link. the method includes: selecting a section of data by the first computer system; when data traffic on the communications link is below transmission capacity, calculating a result of a function based on a time to compress the section and a link latency for the section; depending on the result, compressing the section; and sending the compressed section to the second computer.

An embodiment of the present invention provides a method for repackaging, by a first computer system, a plurality of packets having a common destination, wherein the first computer system is connected to a second computer system by a communications link. The method includes: receiving the plurality of packets, wherein each packet includes application data; extracting from the plurality of packets, information including the application data; creating a new packet including the information; and sending the new packet to the second computer system.

Another embodiment of the present invention provides a method for providing a semi-permanent Transport Control Protocol (TCP) connection between a first computer system and a second computer system using a TCP/IP protocol. The method includes: establishing a TCP connection between the first computer system and the second computer system; receiving application information by the first computer system from a plurality of source addresses; sending the second application information, by the first computer system, over the TCP connection; and disconnecting the TCP connection.

Another embodiment of the present invention provides a method using a first computer system for pruning a plurality of duplicate data requests from a plurality of second computer systems, the plurality of duplicate data requests having a common destination. The method includes: receiving the plurality of duplicate data requests by the first computer system; recording return addresses of the plurality of second computer systems; creating a consolidated data request, including common data from the plurality of duplicate data requests, with the first computer system as a source address; and sending the consolidated data request.

Another embodiment of the present invention includes a method for providing a plurality of Virtual Private Networks by a plurality of computers connected together by a public communications network. The method includes: establishing a first Virtual Private Network of the plurality of Virtual Private Networks between a first computer of the plurality of computers and a second computer of the plurality of computers by using a centralized permission table having the first computer's address and the second computer's address; and establishing a second Virtual Private Network of the plurality of Virtual Private Networks between the first computer and a third computer of the plurality of computers by using the centralized permission table further having the third computer's address.

Yet another embodiment of the present invention includes a method for repackaging, by a first computer system, a plurality of packets having a common destination, wherein the first computer system is connected to a second computer system by a communications link. The method includes: receiving the plurality of packets, wherein each packet includes application data; extracting from the plurality of packets, information including the application data; creating a number of new packets including the information, wherein the number of new packets is determined based on the data traffic on the communications link; and sending the number of new packets to the second computer system.

Another embodiment of the present invention includes a system for increasing a flow of information in a communications network having a standardized communications protocol. The system includes: a first module sending a packet, having first application information and first control information, using the standardized communications protocol; a second module for receiving the packet and sending a super packet using the standardized communications protocol, where the super packet has second application information and second control information, wherein the second application information includes the first application information and some of the first control information; and a third module for receiving the super packet using the standardized communications protocol.

A further embodiment of the present invention includes a method for reducing time for a requester computer system to retrieve information from a remote data storage via an intermediary computer system. The method includes: receiving a request by the intermediary computer system to retrieve data from the data storage; retrieving a first data item from the data storage by the intermediary computer system; and the intermediary computer system, concurrently sending the first data item to the requester computer system, while retrieving a second data item from the data storage.

An embodiment of the present invention includes a system for increasing performance in a network segment between two Super Modules of a plurality of Super Modules in a communications network. The system includes: a first Super Module of the plurality of Super Modules for receiving a plurality of IP packets and sending a modified data packet, where the data packet includes application data combined from said plurality of IP packets; and a second Super Module of the plurality of Super Modules for receiving the modified data packet, where the second Super Module, has a TCP/IP communication protocol stack with an additional application layer for processing the modified data packet.

These and other embodiments, features, aspects and advantages of the invention will become better understood with regard to the following description, appended claims and accompanying drawings.

BRIEF DESCRIPTION OF THE DRAWINGS

FIG. 4-1 is an example of a conventional TCP/IP and two modified TCP/IP protocol stacks of an embodiment of the present invention.

FIG. 11-1 illustrates an example of performing data retrieval and transfer in parallel of an aspect of the present invention.

DETAILED DESCRIPTION OF THE INVENTION

In the following description, numerous specific details are set forth to provide a more thorough description of the specific embodiments of the invention. It is apparent, however, to one skilled in the art, that the invention may be practiced without all the specific details given below. In other instances, well known features have not been described in detail so as not to obscure the invention.

In order for individuals and businesses to use the Internet as an effective commercial vehicle, the time for a user to request and receive information must be significantly reduced compared to the typical times that occur today. The present invention provides both a "super" system that may be overlaid on parts of the Internet infrastructure and techniques to increase information flow in the network, which, either separately or in combination, significantly reduce the user's wait time for information from, for example, Web sites or other users.

Figure 1:
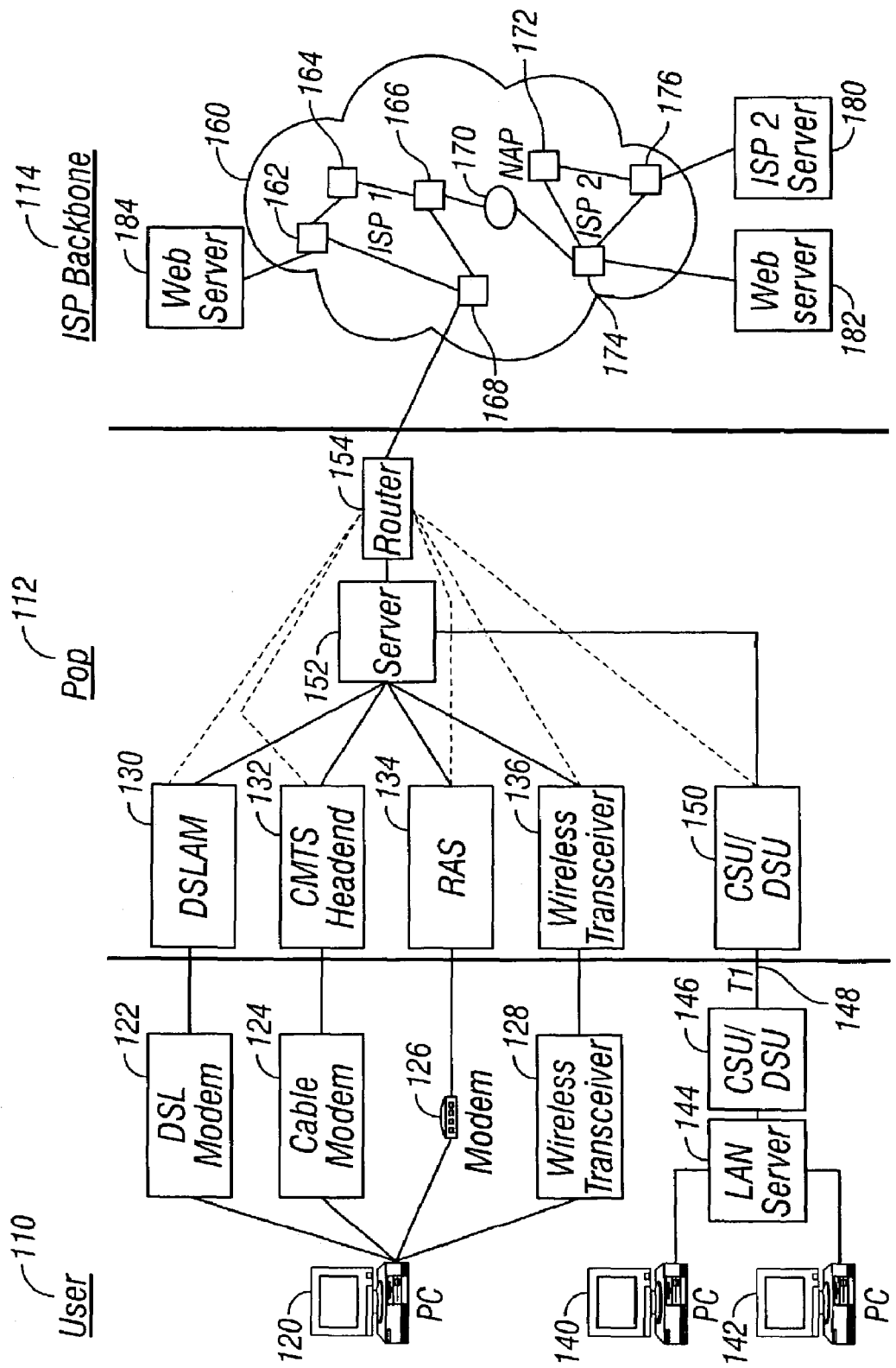
FIG. 1 is a block diagram showing a user connection to the Internet of the prior art.
Figure 2:
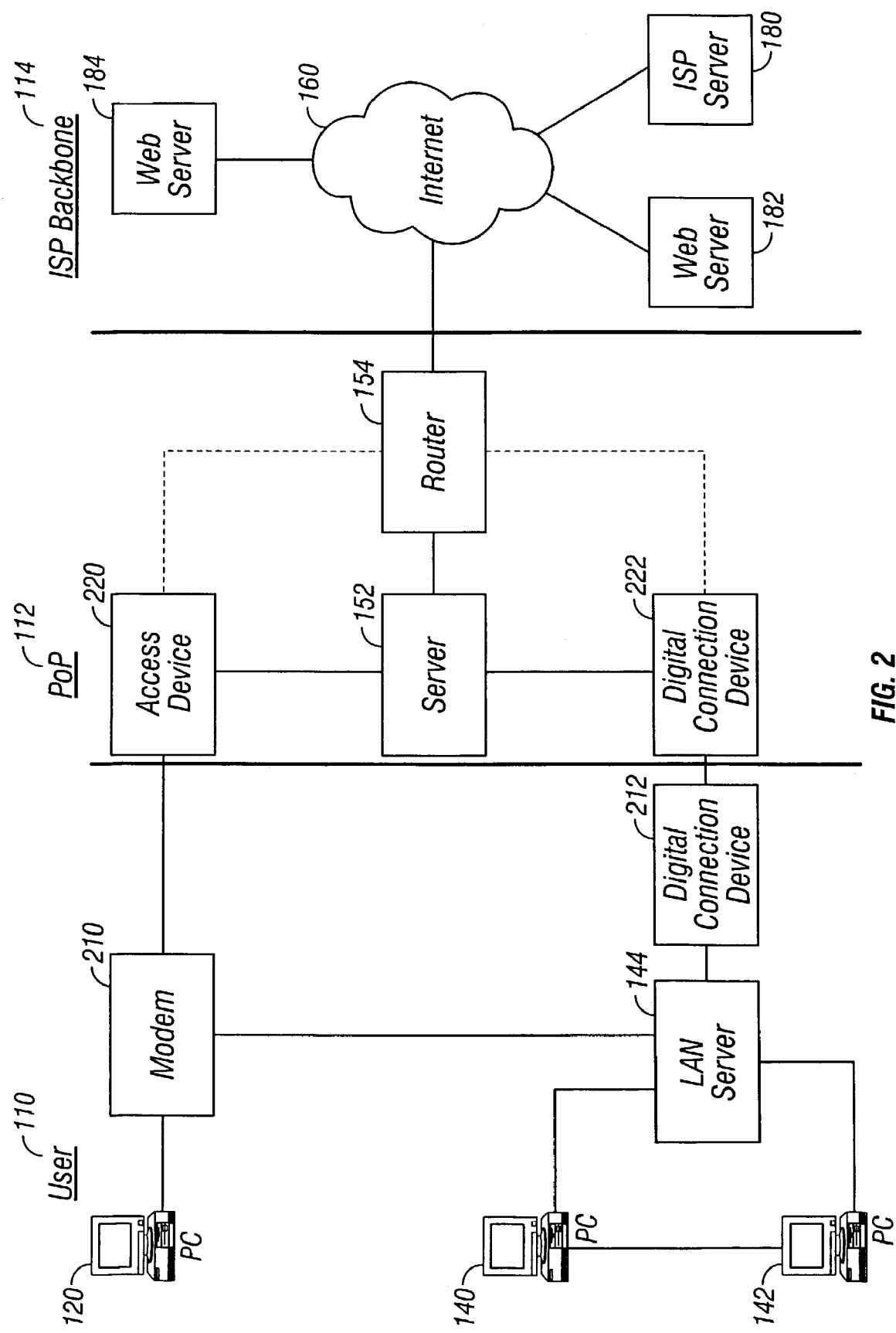
FIG. 2 is a simplified, but expanded, block diagram of FIG. 1 and is used to help explain the present invention.

FIG. 2 is a simplified, but expanded, block diagram of FIG. 1 and is used to help explain the present invention. Where applicable the same labels are used in FIG. 2 as in FIG. 1. The modem 210 includes the DSL modem 122, cable modem 124, dial-up modem 126, and wireless transceiver 128 of FIG. 1. Likewise the access device 220 includes the corresponding DSLAM 130, CMTS Headend 132, RAS 134, and wireless transceiver 136 of FIG. 1. The digital connection devices 212 and 222 include the CSU/DSU devices 146 and 150, and in addition include, satellite, ISDN or ATM connection devices. FIG. 2 has an additional connection between LAN server 144 and modem 210, to illustrate another option for a LAN to connect to the PoP 112 besides the digital connection device 212. Most of the computer and network systems shown in FIG. 2, communicate using the standardized Transport Communication Protocol/Internet Protocol (TCP/IP) protocol.

Figure 3:
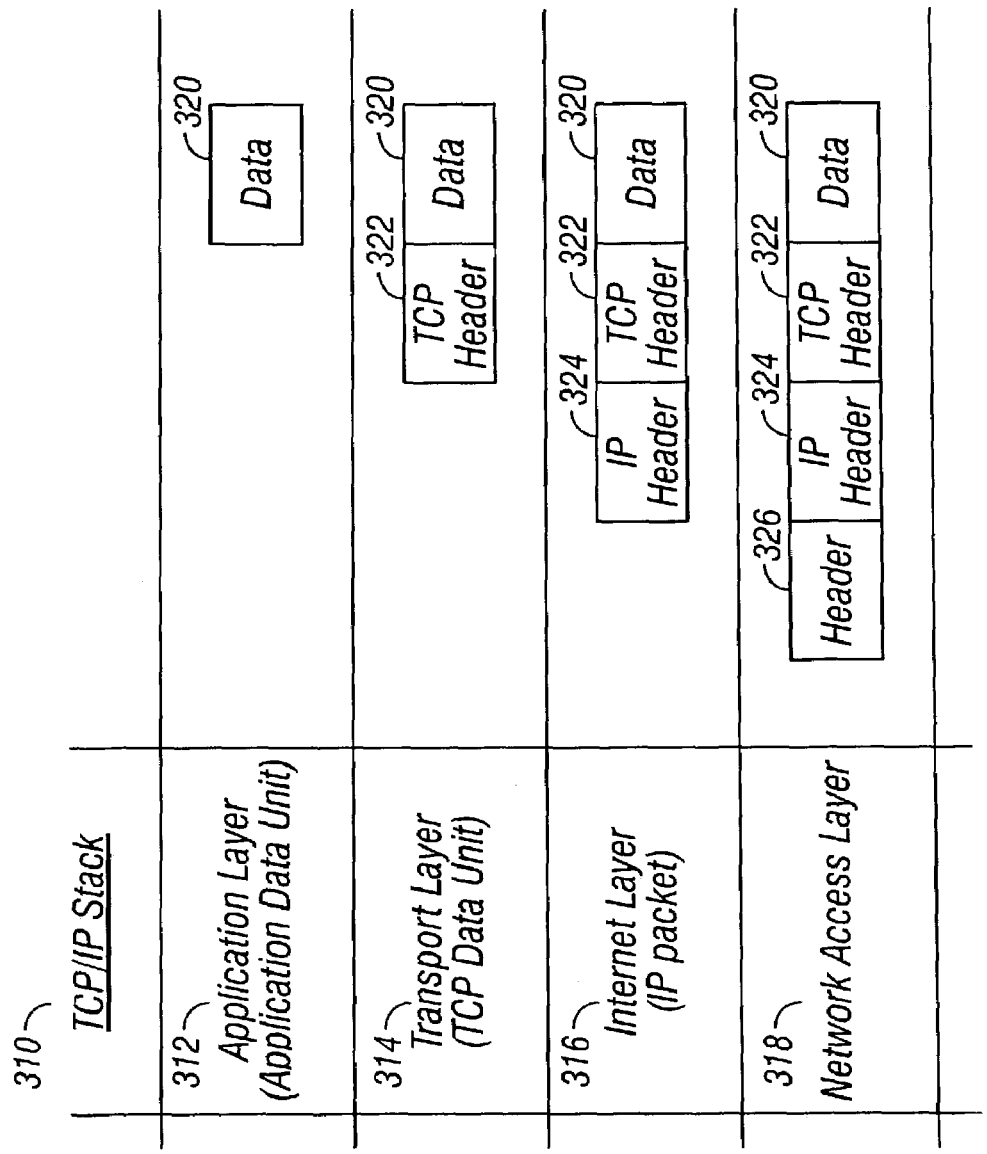
FIG. 3 shows the TCP/IP protocol stack and the associated data units for each layer.

FIG. 3 shows the TCP/IP protocol stack and the associated data units for each layer. The TCP/IP protocol stack 310 includes an application layer 312, transport layer 314, Internet layer 316, and network access layer 318. The application layer receives the application or user data 320, one block or unit of data, which we will call an application data unit. For example, a user request for a Web page would be one application data unit. There are numerous application level protocols in TCP/IP, including Simple Mail Transfer Protocol (SMTP) and Post Office Protocol (POP) used for e-mail, Hyper Text Transfer Protocol (HTTP) used for the World-Wide-Web, and File Transfer Protocol (FTP).

The transport layer 314 includes the Transmission Control Protocol (TCP) and the User Datagram Protocol (UDP). TCP is a connection oriented protocol that provides a reliable virtual circuit between the source and destination. TCP guarantees to the applications that use it to deliver the stream of bytes in the order they were sent without duplication or data loss even if the IP package delivery service is unreliable. The transport layer adds control information via a TCP header 322 to the data 320 and this called a TCP data unit. UDP does not guarantee packet delivery and applications which use UDP must provide their own means of verifying delivery.

The Internet layer 316 is named because of the internetworking emphasis of TCP/IP. This is a connectionless layer that sends and receives the Internet Protocol (IP) packets. While the IP packet has the original source address and ultimate destination address of the IP packet, the IP layer at a particular node routes the IP packet to the next node without any knowledge, if the packet reaches its ultimate destination. The IP packet includes an IP Header 324 added to the TCP data unit (TCP header 322 and data 320).

The network access layer 318 is the bottom layer that deals with the physical transfer of the IP packets. The network access layer 318 groups together the existing Data Link and Physical Layer standards rather than defining its own. This layer defines the network hardware and device drivers. A header 326 and a trailer (not shown) are added to the IP packet to allow for the physical transfer of the IP packet over a communications line.

An example of the use of the TCP/IP protocol in FIG. 2 is a user at the PC 140 requesting a web page from web server 182. The user through his browser creates a user request for a Web page, i.e., application data unit 320 (FIG. 3), at the application layer 312. The TCP/IP stack 310 creates one or more TCP data units where each TCP data unit has part of the application data unit 320 with a TCP header 322 appended to it. The transport layer 314 at PC 140 establishes a peer-to-peer connection, i.e., a virtual circuit, with the TCP the transport layer 314 at web server 182. Each TCP data unit is divided into one or more IP packets. The IP packets are sent to LAN server 144 and then to PoP server 152, where they are then sent out to the Internet 154 via PoP router 154. The IP packets proceed through multiple paths on Internet 160 and arrive at web server 182. The transport layer 314 at web server 182 then reassembles the TCP data units from the IP packets and passes the TCP data units to application layer 312 to reassemble the user request. The user request to get the web page is then executed. To send the web page back to the user, the same TCP virtual circuit may be used between the transport layers of the Web server 182 and PC 140. The web page then is broken up into TCP data units, which are in turn broken up into IP packets and sent via Internet 160, PoP router 154, PoP server 152, LAN server 144, to PC 140.

There are several problems that occur in the above example of a conventional interaction between a user and a Web server. First the maximum transmission unit (MTU), i.e., the maximum amount of data, in an Ethernet frame is 1500 bytes. However, the largest value for the data 320 in TCP/IP is about 64,000 bytes. For example a 16 Mbps token ring has about a 18,000 byte MTU and a dial-up connection using a modem has about a 576 byte MTU. This means that even though the MTU leaving the LAN server 144 may be greater than 1500 bytes, the virtual circuit between PC 140 and Web server 182 will typically use packets with a MTU having the lowest of the MTUs between the user and the Web server, i.e., there will be many small IP packets sent back and forth. Second, there is not just one request and one response, but a whole series of browser requests and Web server responses that occur, when a user is using a Web site. For example, a user request for a web page with graphics is actually broken down by the browser into multiple requests, a request for the hypertext markup language (HTML), followed by several requests for the graphics. Third, the text and graphics are usually sent in uncompressed format, despite the fact that compression may reduce the size of the files considerably. Thus these and other problems cause the conventional TCP/IP network to have significant delay in getting data from the Web server to the user.

Figure 4A:
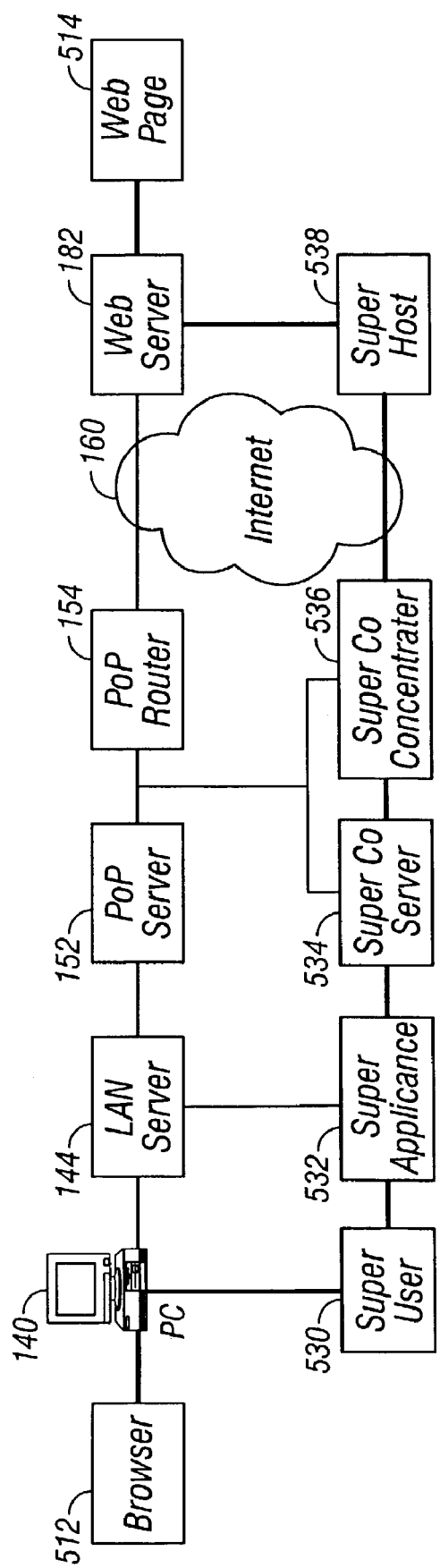
FIG. 4 is a block diagram of the communication path between a browser and a web server of an embodiment of the present invention.
Figure 4B:
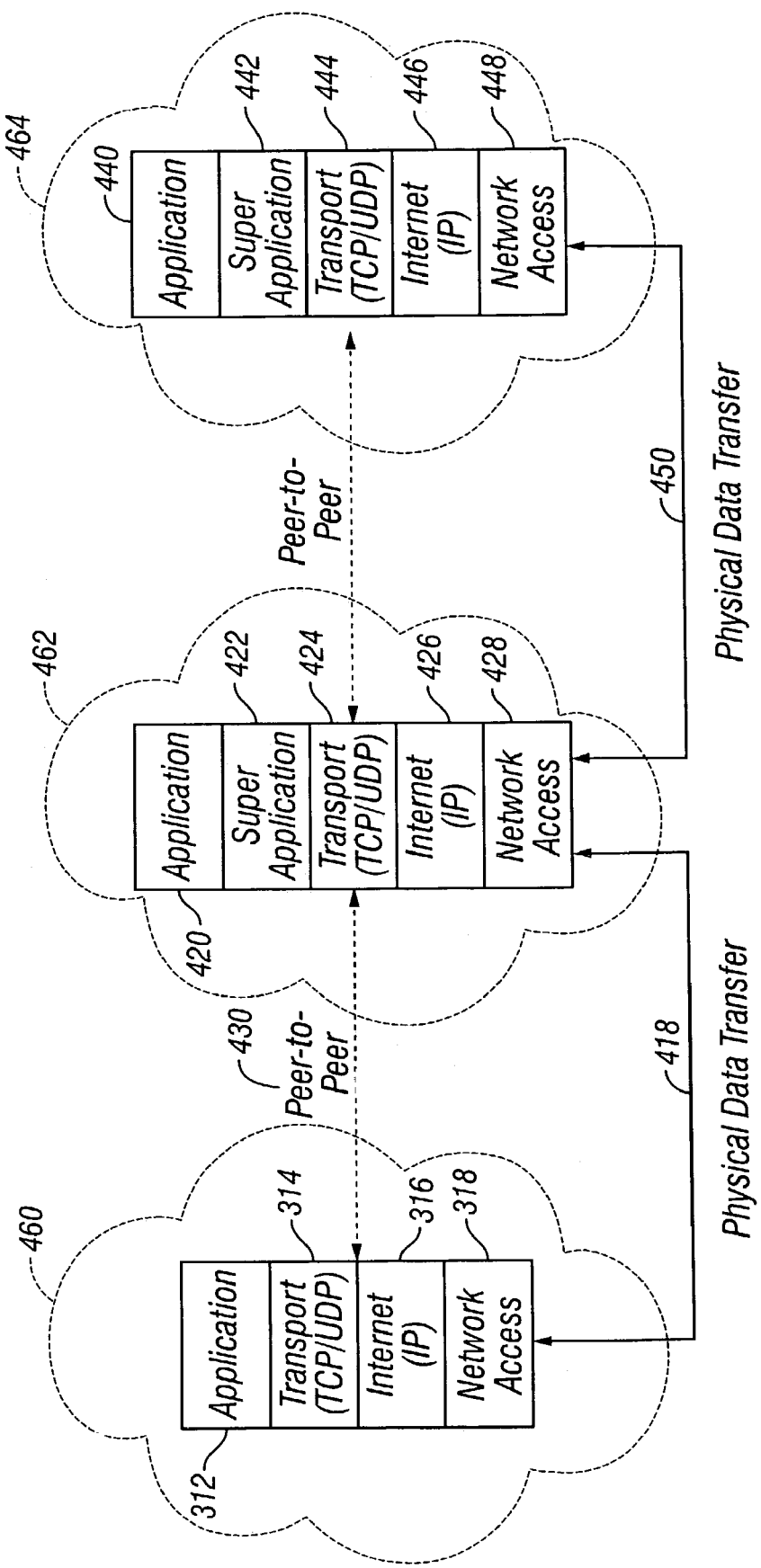

FIG. 4 is a block diagram of the communication path between a browser and a web server of an embodiment of the present invention. The conventional exchange between browser 512 and web server 182, when a user using browser 512 requests a Web page 514 from web server 182, was described above. An embodiment of the present invention creates a plurality of "super" modules, including Super User 540, Super Appliance 532, Super Central Office (CO) Server 534, Super CO Concentrator 536, and Super Host 538, that provides an alternative super freeway path to exchange data between browser 512 and web server 182. The user request for Web page 514 is sent by browser 512, executing on PC 140, to Super User software 530 also running on PC 140. Super User 530 then sends the user request to Super Appliance software 532 running on LAN server 144 (or in an alternative embodiment executing on its own server). Super Appliance 532 then sends the user request to Super CO Server 534, which sends the request to Super CO Concentrator 536. The Super CO Server 534 and Super CO Concentrator 536 may be standalone servers or may be software that runs on PoP server 152. Super CO Concentrator 536 sends the user request via Internet 160 to Super Host 538 which may have its own server (or in an alternative embodiment Super Host 538 is software that runs on web server 182). The user request proceeds from Super Host 548 to web server 182, which retrieves web page 154 from a web site running on web server 182 (the web server 182 may include a Web farm of servers and multiple Web sites). The web page 514 then proceeds back to browser 512 via Super Host 538, Super CO Concentrator 536, Super CO Server 534, Super Appliance 532, and Super User 530.

In other embodiments, one or more of the Super Modules may be missing, for example, the Super Appliance 532. In the case of a missing Super Appliance 532, Super CO Server 534 exchanges information with Super User 530 through LAN server 144. Another example is if Super Host 548 was not present, then web server 182 exchanges information with Super CO Concentrator 536. Thus if a Super Module is missing, the corresponding normal module, e.g., PC 140, LAN server 144, PoP server 150, PoP router 154, and web server 182, is used instead. All or some of the Super Modules can be used and as long as there is at least one communication link between at least two different Super Modules, the information flow across the link improves significantly. Additionally, more Super Modules can deployed to extend the granularity of the super layer over the network.

In addition to the user-to-server application described above, Super Modules within an Internet or network structure can be used to increase performance over those network segments. In such an embodiment, all data transferred between multiple Super Modules within the network structure is optimized. For example, communication between Super CO Server modules in different parts of the network is particularly attractive for improving efficiency of expensive or bandwidth limited links, such as trans-continental lines or satellite communication. This embodiment also improves the performance of and reduces the cost of communications between any two network points with Super Modules. The interoperability of any Super Modules also allows for a tiered approach to optimize communications for a logical or physical region. For example, several local Super CO Servers can tier to a regional Super Module, which in turn tiers to a national Super Module. This tiering approach extends the granularity of the super application layer throughout the network for all network traffic between the Super Modules, independent of the applications or the original source (i.e., there can be a combination of data from any number of Super Modules sources or any number of normal module sources).

FIG. 4-1 is an example of a conventional TCP/IP and two modified TCP/IP protocol stacks of an embodiment of the present invention. Application layer 312, transport layer 314, Internet layer 316, and Network Access layer 318 are the same layers as in TCP/IP protocol stack 310 of FIG. 3 and are for a normal module 460, e.g., PC 140. Application layers 420 and 440, "Super" Application layers 422 and 442, transport layers 424 and 444, Internet layers 426 and 446, and Network Access layers 428 and 448 are the modified TCP/IP protocol stacks of the embodiment and are for Super Modules 462 and 464, e.g., Super Appliance 532 and Super User 530. Normal module 460 is connected to Super Module 462 via communications link 418, and Super Module 462 is connected to Super Module 464 via communications link 450.

The Super Module 462 upon receiving IP packets from one or more normal modules 460 extracts all the application layer data and applicable data from the IP and TCP headers of the IP packets to the Super Application layer 422. The application layer data from the normal modules and from the application layer 420 may be of any protocol, e.g., HTTP 1.0, HTTP 1.1, FTP, POP, SMTP, etc. The Super Application layer packages the application data and appropriate TCP layer and IP layer data into one big application layer data unit. Between Super Modules 462 and 464 the normal TCP/IP transport mechanism is used. This means that, when there are one or more intermediary normal nodes between Super Module 462 and Super Module 464, the TCP/IP stack like in normal module 460 is used to transfer the one big application layer data unit. When, for example, Super Module 464 must deliver an application packet to a normal module. The one big application layer data unit is unbundled by Super Application layer 442, the TCP/IP packet reconstructed and sent to the normal node. Thus effectively many partially filled packages of data, each with overhead address information, can be recombined into one big package. For long haul, e.g., overseas, communication, the analogy is similar to the cost savings due to container shipping.

Figure 5:
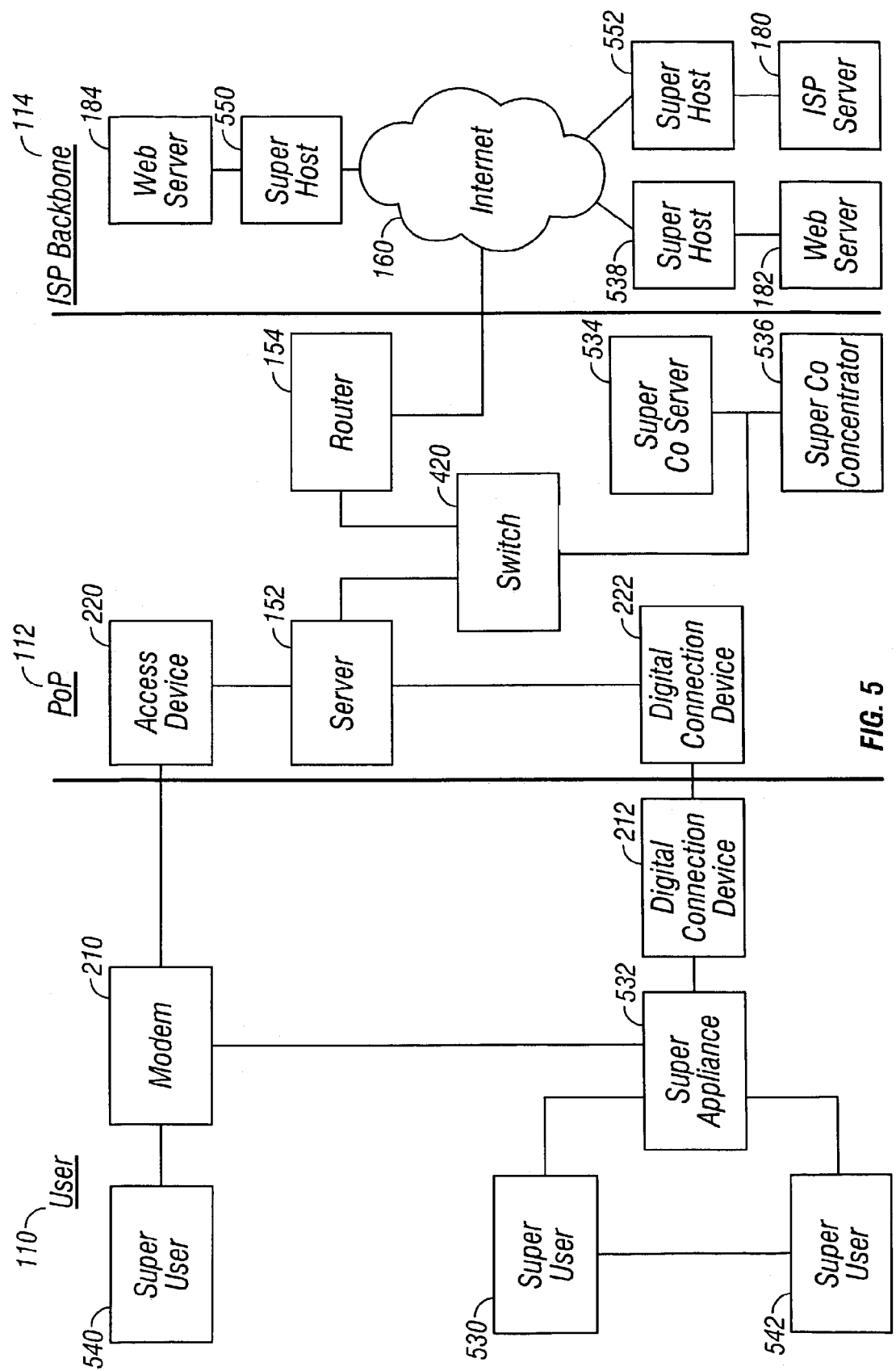
FIG. 5 is a block diagram of the Super Modules inserted in the conventional system of FIG. 2 of an embodiment of the present invention.

FIG. 5 is a block diagram of the Super Modules inserted in the conventional system of FIG. 2 of an embodiment of the present invention. The same labels are used in FIG. 4 as in FIG. 2 where the devices are the same or similar. Super User 540 is connected through modem 210 is connected to PoP Server 152 via access device 220. A local area network having Super User 530, Super User 542, and Super Appliance 532 is connected to modem 210 or digital connection device 212, where digital connection device 212 is connected to PoP server 152 by digital connection device 222. Super Appliance 532 includes software executing on LAN server 144. Server 152 is connected to router 154 via switch 420, which detours the packet traffic to Super CO Server 534 and Super CO Concentrator 536. Router 154 is connected to the Internet cloud 160. From Internet 160, traffic can go to Super Host 538 connected to web server 182 or to Super Host 550 connected to web server 184 or to Super Host 552 connected to ISP Server 180.

Super System Components

Described below is one embodiment of each of the components of the super system of FIG. 5, including Super User 540, Super Appliance 532, Super CO Server 534, Super CO Concentrator 536, and Super Host 538.

The Super User 530 includes software which resides on the user's PC, e.g., PC 140. A browser, e.g., Microsoft's Internet Explorer, is set to proxy to the Super User 530, so that all browser requests for data are supplied from the Super User 530. In addition, all user requests via the browser are sent to the Super User 530. Hence the browser is isolated from the rest of the network by the Super User. The Super User caches all the data the user has requested in a local cache on the user's PC, so that when the user requests the data again, it may be retrieved locally, if available, from the local cache. If the data that is cached exceeds a predetermined file size, then the Super User analyzes all the data in the local cache and deletes the data that is least likely to be used. For example, a conventional least recently used algorithm may be used to discard old data. Some of the software function of Super User 540 are:

1. Caching: If the browser requests data that exists in the local cache and the data meets the cache life requirements, then the data is supplied from the local cache. Otherwise the data is retrieved from the nearest Super Module cache, e.g., the Super Appliance 532 or Super CO Server 534, Super CO Concentrator 536, or Super Host 538, where the updated data is available or if not available from any Super Cache then from the Web server. Each data element has a cache life, that is how long it can be used from a cache before it needs to be refreshed.

2. Refreshing the Cache: When the Super User PC is idle (not actively retrieving data from the Internet), the Super User checks the local cache and automatically refreshes data that is reaching its cache life. The Super User, using Artificial Intelligence (AI) or other techniques, prioritizes the refreshing based on what it determines the user is most likely to request. For example, the Super User can keep a count on how often a user accesses a web page. A higher count would indicate that the user is more likely to request that web page in the future, and the Super User would automatically refresh that page.

3. Pre-fetching: Using AI or other techniques the Super User, during idle times, pre-fetches web pages (i.e., retrieves web pages that the user has not yet asked for) that have a high probability of being needed by the user. For example, if a user is viewing some pages on a catalog site, then there is a high probability that the user will view other pages on the site in the same category. The Super User would pre-fetch these pages. The pre-fetching increases the probability that the user will get the data from the local cache.

4. Courier packets (described later) are packaged and the packaged data compressed by the Super User before being sent to the Super Appliance or Super CO Server. Courier packets are un-packaged and the un-packaged data uncompressed by the Super User before being sent to the browser.

The Super Appliance 532 includes software executing on LAN server 144. Some of the functions performed by the Super Appliance 532 includes, firewall security, global caching, teaming, smart hosting, and email management. Further function performed by the Super Appliance software include:

1. If the Super Appliance is attached to a Super CO Server, then all the data transmitted between them is compressed and packaged into courier packets, otherwise standard Internet requests are used and the responses are packaged into courier packets before the responses are sent to the Super User.

2. The Super Appliance also automatically copies and maintains web sites that are used frequently by its users.

3. If the Super Appliance is attached to a Super CO Server, then it updates its copy of the web sites only when notified of changes from the Super CO Server. If the Super Appliance is not attached to a Super CO Server then it checks for updates of the web sites during idle times and/or during periodically predetermined intervals.

4. If Super Users are attached to the Super Appliance then all data responses are transmitted in compressed format to the Super Users. If regular users are attached to the Super Appliance, then the data responses are decompressed in the Super Appliance and sent to the users. If the Super User is maintaining web sites, then anytime a web page is updated on the Super Appliance a notification is sent to the Super User so that the Super User may request the change.

5. The Super User will also notify the Super Appliance of information about the user's PC monitor density so that adjustments can be made to the graphics transmitted over the local area network. Sending high density graphics to a monitor that can not display the graphics is a waste of network resources. The software in the Super Appliance adjusts the graphics density before transmitting the data.

6. If more than one Super User requests the same data, then the Super Appliance implodes the request and sends only one request to the next Super Module, e.g., the Super CO Server. If there is not another Super Module between the Super Appliance and the Web site, then the request is still imploded and a standard TCP/IP request is made. When the response to the imploded request is received then the data is exploded by the Super Appliance and the data is sent to the appropriate Super Users.

The more web sites that are maintained at the Super Appliance the more the access speed for web pages approaches the local area network speed. The more web pages maintained at the Super User the more the web access speed approaches hard disk access speed. The more web pages that can be copied and maintained on the Super Appliance and the Super User, the less the last mile becomes a bottleneck for response time.

The Super CO Server 534 is the bridge between the Internet backbone 114 and the user 110. One objective of the Super CO Server 534 is to minimize the traffic between the user and the Internet. The Super CO Server accomplishes this by copying the web sites accessed by the Super Users or normal users via the Super CO Server. The more web sites that are hosted on the Super CO Server, the more the network is optimized by reducing the movement of data across the network. If the web sites that are hosted at Super CO Server come from web sites stored on a Super CO Concentrator 536, the Super CO Server 534 requests updated web pages whenever notified by the Super CO Concentrator 536 that the web pages have changed. Web pages from the Super CO Concentrator 536 are stored in compressed and repackaged format. If the web sites that are hosted on the Super CO Server are not stored in the Super CO Concentrator, then the Super CO Server checks at predetermined intervals for changes in the web site at the hosting web server. The Super CO Server keeps a log of the web sites that are hosted on every Super Appliance 532 cache. As changes occur to web sites that exist on a Super Appliance cache, a notification is sent to that Super Appliance that changes have occurred and that the Super Appliance should request updated copies of the changed web pages. As data is received from a non Super CO Concentrator site it is compressed, packaged and stored on the Super CO Server. The Super CO Server determines from its request logs the web sites that are being accessed by its users and determines which web sites to copy and maintain at the Super CO Server 534 cache. The Super CO Server will also delete sites that are not being used. If a web site is not being stored and maintained, the web page is maintained in a separate global cache so that if it is requested again it can be supplied from the global cache. A correct balance needs to be maintained between the global cache and the web hosting. The global cache and Super CO Server can be implemented as one cache and managed separately or implemented as two separate caches. If a web page is requested from a Super Appliance then the web page is sent in super compressed and repackaged format, otherwise the web page is decompressed and sent to the requesting user. The Super Module closest to the user unpackages any repackaged formats and decompresses the data so that it is sent to the user in native form. The Super Module closest to the user also caches the information in non-compressed and non-packaged format. The optimizations used are related to the amount of compression applied to the variable data (usually text) and the amount of variable data on the web page. The more Rich Data formats are used on the Internet the more optimization is achieved. Flash software, files, java programs, java scripts etc. are all stored at the Super CO Server.

The data requests from the Super Appliances that are not satisfied by the Super CO Server cache are sent to the Super CO Concentrator 536 that is responsible for servicing the URL (web site) requested. The requests are packaged compressed and imploded according to the optimization schemes. In one embodiment, the first level of data implosion occurs at the Super CO Server. In an alternative embodiment implosion is done by the Super Appliance. The Super CO Server is organized by ISP geography so that duplicate usage characteristics that are regionally oriented can be imploded on request and exploded on response. All requests and imploded requests that cannot be responded to by data in the Super CO Server's cache are passed to the Super CO Concentrator.

The Super CO Concentrator 536 is organized by Web sites (URL's). This increases the probability that Web site data that users need will be in the CO concentrator's cache. It also increase the probability that requests can be imploded and network traffic can be reduced. Each Super CO Concentrator is responsible for caching and interfacing with the Super Hosts, e.g. 538, and other non Super Host web sites. For non Super Host web sites, Super CO Concentrator 536 is the first Super Module encountered and the initial repackaging, first compression, final implosion, first explosion, the conversion of all graphics to an optimized compression format, such as PNG or proprietary compression algorithms, and the first level of super caching occurs. This is also where all the checking and refreshing occurs for the other Super Modules. As data from the Web sites is refreshed and updated the Super CO Servers are notified so that all caches can be updated and refreshed.

The Web server hosts one or more web sites that are attached to the Internet. The Super Host, i.e., Super Host 538, replies to requests made from the Super CO Concentrators, e.g., 536. Each time a request is made for a down load of any web site hosted on the Web server, the Super Host 538 retrieves the web pages from the Web server and compresses and packages the contents before sending it to the requesting Super CO Concentrator. This improves the efficiency of the web transport by the effective compression rate and by sending a single data block for all the requested web page data. Each piece of information is analyzed and compressed using techniques that best perform for the specific type of data. As each Super CO Concentrator request is received, the Super Host records the IP address of the Super CO Concentrator. The Super Host checks the web sites contained on the Web server and sends notifications of any changed web pages to any Super CO Concentrator that has requested data from the web sites historically. This allows the Super CO Concentrator to know when it needs to refresh its version of the Web site and minimizes Web traffic by allowing the Super CO Concentrator to service user requests for web pages directly from its version of the web page in the Super CO Concentrator's cache. The only time the Super CO Concentrator version of the web page needs to be refreshed is when it has changed. This allows for minimized traffic from the web hosting sites to the ISP sites. There are many ISP sites accessing data at each web site. This is a step in moving web sites to the outer fringe of the Internet and bringing compression and packaging to the inner workings of the Internet. The challenge of moving web sites to the outer fringes of the Internet is to make sure data is current, the interlocking of the Super Module caches insures this.

Compression and Efficient File Format

Data compression is particularly useful in communications because it enables devices to transmit the same amount of information in fewer bits. There are a variety of data compression techniques, but only a few have been standardized. In addition, there are file compression formats, such as ARC, GZIP and ZIP.

One aspect of the present invention compresses data as close to the source of the data as possible and passes that compressed data along the network to a point where its is necessary to decompress. The compressed data is stored in compressed format at each Super Module between the source and destination, although not necessarily in the same compressed format. This allows the compression to change along with the load dynamics of the network. The conventional browser technology needs decompressed data, thus the data at the web site should be compressed and only decompressed just before being handed off to the browser. A significant need for compression is the last mile for that is where bandwidth limitations exist. Hence it is important that compression occur between the Super CO Server 534 and the Super Appliance 532 or Super User 540.

Figure 6:
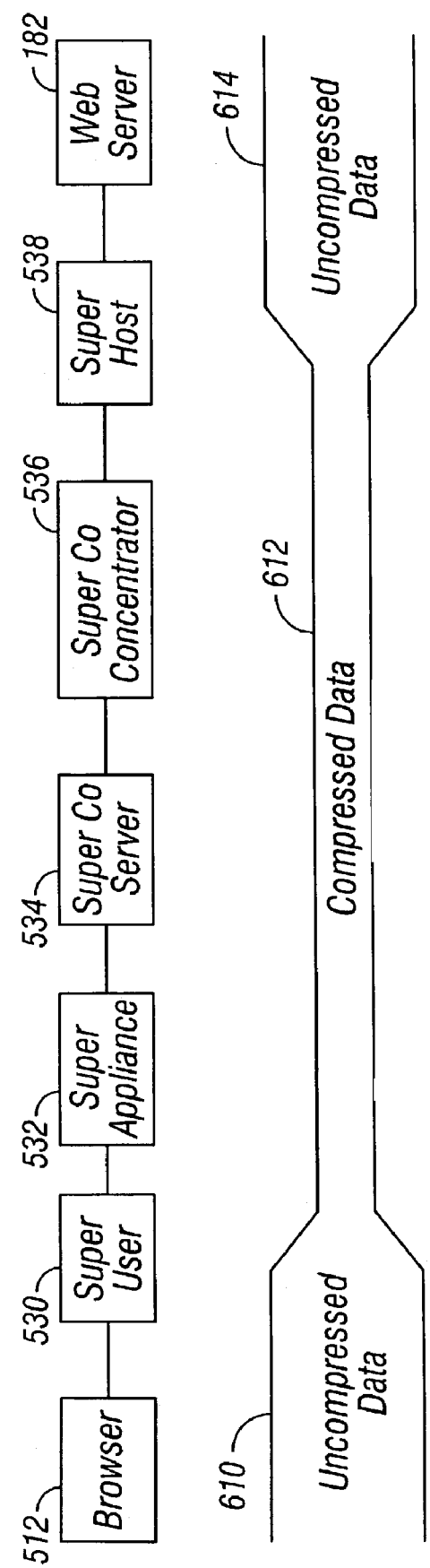
FIG. 6 shows a compressed data tunnel between the browser and web server of an embodiment of the present invention.

FIG. 6 shows a compressed data tunnel between the browser and web server of an embodiment of the present invention. Browser 512 uses uncompressed data 610 and web server 182 uses uncompressed data 614. The uncompressed data 610 is compressed by the Super User 530 and the compressed data 612 is sent via Super Appliance 532 to Super CO Server 534 to Super CO Concentrator 536 to Super Host 538 which uncompresses the data into uncompressed data 614 for used by web server 182. Similarly the web page data from web server 182 is compressed by Super Host 538 and sent as compressed data 612 to Super User 530 were it is uncompressed to uncompressed data 610 for use by browser 512. Thus the data is kept in compressed format for as long as possible during the transfer from web server 182 to browser 512 and vice versa.

Another embodiment of the present invention uses different compression algorithms for different data formats, where a data format is an established layout for data. In general, data formats include bitmaps (strings of 1's and 0's) that describe images or sound patterns or both, binary (executable computer programs), text formats, (in which typically each byte value is mapped to a character), and numeric data formats (used by spreadsheet and other database programs). Data formats may further include flash for vector graphic animations, audio information and motion video information for multimedia applications and word processing documents which have embedded layout control characters. By selecting a compression algorithm based on data format, better results, e.g., a smaller compresses file size, can be achieved than using a generic algorithm for all data formats. For example, much more aggressive compression techniques can be used on text data than on graphics or binary files.

Figure 7:
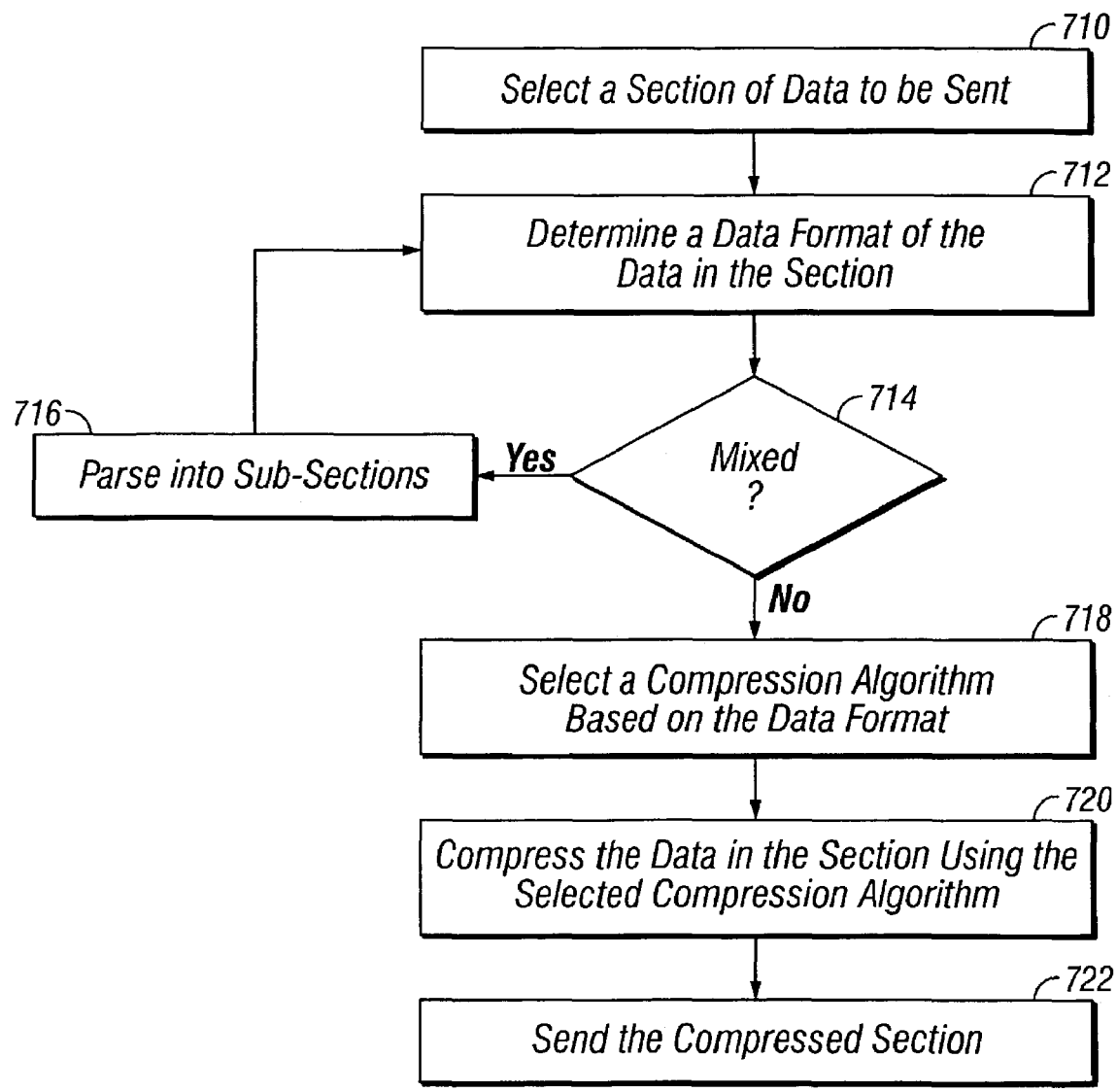
FIG. 7 shows a compression algorithm based on data format of the transmitted data of an embodiment of the present invention.

FIG. 7 shows a compression algorithm based on data format of the transmitted data of an embodiment of the present invention. At step 710 a section of data, e.g., an application data unit, file, part of a file, was selected to be sent by a sender Super Module. The data format of the data in the section is determined by the sender Super Module (step 712). At step 714 the data in the section is examined to determine if it is of a single or mixed format, e.g., the text and attached graphics in a Microsoft® Outlook email message would be a mixed format. If the data format is mixed, then at step 716 the section is parsed into subsections, e.g., Microsoft® Outlook email message is parsed into a text section and a graphics section, and the process is repeated with each sub-section at step 712. If the data in the section is of a single format then at step 718 a compression algorithm based on the data format is selected. For example for the text section, e.g., GZIP can be used and for the graphics section, e.g., wavelet compression can be used.

There is a default compression algorithm to insure the data is compressed. At step 720 the data the section is compressed using the selected compression algorithm, and each data section is tagged with the algorithm that was specifically used at the specific time the compression was done. At step 722 the compressed section is sent to a receiver Super Module which has the decompression algorithms.

There is a trade off between reducing transmission latency due to compression and the time it takes a processor to compress the section of data. The goal is to minimize the users wait time for the data. Hence, at times, it may take more time to compress and send the section of data, then to send the section of data uncompressed; hence the section of data should not be compressed In choosing the different compression algorithms with different compression amounts and compression times, system operating conditions such as available processing cycles or available temporary storage space, need also to be considered. Each Super Module selects the compression algorithms based upon operating knowledge of the network. This operation knowledge is passed between Super Modules along with the data in the courier packets. For example, if the Super Module is busy, i.e., there are few available processing cycles, a less computationally intensive compression should be used, i.e., effectively the compression time is increased. This allows the compression to change along with the load dynamics of the network.

Figure 8:
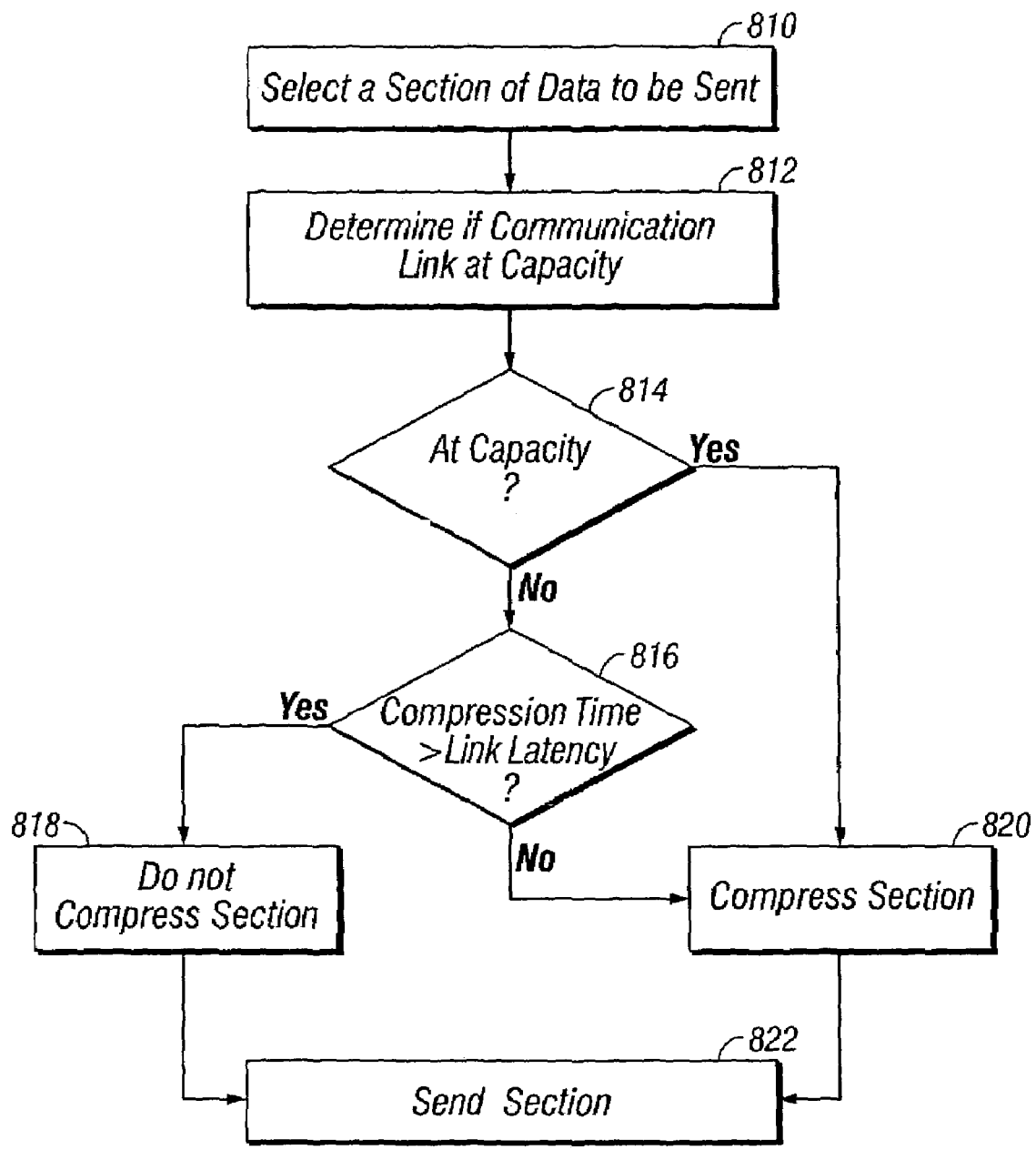
FIG. 8 is a flowchart determining whether or not the data should be compressed of another embodiment of the present invention.

FIG. 8 is a flowchart determining whether or not the data should be compressed of another embodiment of the present invention. At step 810 a section of data is selected to be sent by a first Super Module to a second Super Module over a communications link. At step 812 the first Super Module determines if the communication link is full, i.e., at link capacity. At step 814 if the link is at capacity, then the section is compressed (Step 820) using a general algorithm, e.g., run length or Huffman encoding, or using the flow chart of FIG. 7. If the link is not at capacity, then at step 816, the time to compress the data section should not be greater than the link latency, i.e., the time it takes for the section of data to be transferred from the first Super Module to the second Super Module, in order for compression to occur (step 820). If it takes longer to compress the data than to transfer it, then there is no compression (step 818). At step 822 the data, either in compressed form from step 820 or in uncompressed form from step 818, is sent.

Figure 9:
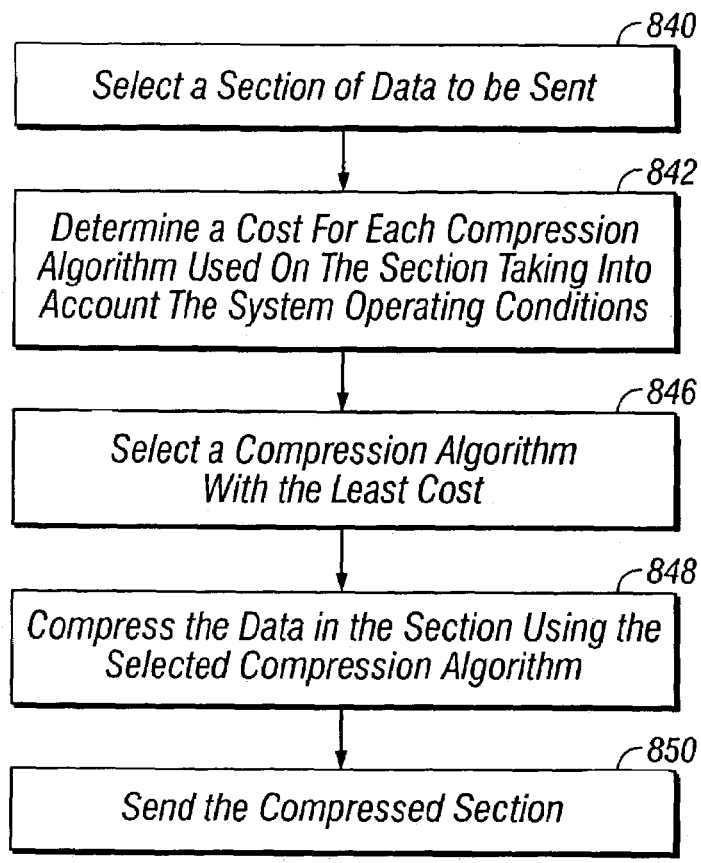
FIG. 9 shows a flowchart for another compression process of yet another embodiment of the present invention.

FIG. 9 shows a flowchart for another compression process of yet another embodiment of the present invention. At step 840 a section of the data is selected to be sent. At step 842 a cost, taking into account the system operating conditions, is determined for compressing the section of data for each compression algorithm in a group of compression algorithms. One compression algorithm of the group is selected with the least cost (step 846). For example, one cost formula is the sum of the time to compress a section of data plus the link latency for the compressed section of data, where the time to compress is a function of the average number of processing cycles available at the time of compression (an example of the system operating conditions). A cost, i.e., sum, is computed using this cost formula for each compression algorithm and the compression algorithm with the least sum is selected. At step 848 the data in the section is compressed using the selected compression algorithm and at step 850 the compressed section is sent.

Besides looking at what should be compressed and how (i.e., the best compression algorithm), where the data is located is also important. In one embodiment the graphic and binary web page data, java scripts, flash programming, and other data that typically doesn't change, and may be less compressible, is maintained at the Super User or Super Appliance site. The variable data contained in web pages, i.e., typically text data, which typically varies, but is highly compressible can be updated from the web server or some intermediate Super Module on the Internet side of the last mile.

In addition, to compression having the data stored in an efficient format, i.e., a format that gives a smaller file size, has an effect similar to compression. In an embodiment of the present invention the first Super Module that encounters an inefficient data format converts it to an efficient format. This improves the transmission and caching of the converted data throughout the rest of the system. An example is the conversion of all graphics data from bitmaps and GIF formats to JPEG formats. This gives is ten to one improvement for bitmaps and a five to one improvement for GIF. Because about 90% of web page graphics are stored in GIF format, conversion to JPEG significantly improves information transfer and storage for web page graphics.

Repackaging

Typical web pages today contain a HyperText Markup Language (HTML) document, and many embedded images. The conventional behavior for a browser is to fetch the base HTML document, and then, after receipt of the base HTML document, the browser does a second fetch of the many embedded objects, which are typically located on the same web server. Each embedded object, i.e., application data unit, is put into a TCP data unit and each TCP data unit is divided into one or more IP packets. Sending many TCP/IP packets for the many embedded objects rather than, e.g., one large TCP/IP packet, means that the network spends more time than is necessary in sending the control data, in other words, the control data/time to application data/time ratio is too large. It is more efficient to combine the many embedded objects into one large application data unit and then create one (or at least a minimum number of) large TCP data unit. For the one large TCP data unit the maximum transmission unit (MTU) for the link between this sender Super Module and the next receiver Super Module is used for the IP packet(s). The sender Super Module will try to minimize the number of IP packets sent by trying to make each IP packet as close to the MTU as practical. For each link between a Super Module sender and a Super Module receiver the MTU is determined for that link and the size of the IP packets may change. Unlike the prior art where the lowest common denominator MTU among all the MTUs of communication links between the user and Web server is normally used, in this embodiment, the MTU of each link is used.

In one embodiment of the present invention application data units, e.g., users requests and Web server responses, are repackaged (or unpackaged) into a larger (or multiple smaller) modified application data unit(s), when necessary, at each Super Module, e.g., Super User, Super Appliance, Super Central Office (CO) Server, Super CO Concentrator, and Super Host. For example, let's combine two IP packets into one IP packet, which is one example of a "courier" packet. The first IP packet has a first IP header, a first TCP header, and a first application data unit. The second IP packet has a second IP header, a second TCP header, and a second application data unit. A first modified application data unit is created which has the first application data unit and a first pseudo header having control data from the first IP Header and first TCP header, such as source address, source and destination ports and other control information needed to reconstruct the first IP packet. A second modified application data unit is created which has the second application data unit and a second pseudo header having control data from the second IP Header and second TCP header, such as source address, source and destination ports and other control information needed to reconstruct the second IP packet. A combined application data unit is made having the first modified application data unit concatenated to the second modified application data unit. A new TCP header and IP header are added to the combined application data unit and the courier packet is formed. Thus necessary control information is embedded in the combined application data unit and the TCP/IP protocol is used to move the combined application data unit between a Super Module sender and a Super Module receiver. When the receiver is not a Super Module the combined application data unit is unbundled and the first IP packet and second IP packet are recreated and sent to the normal receiver by the Super Module sender.

Figure 10A:
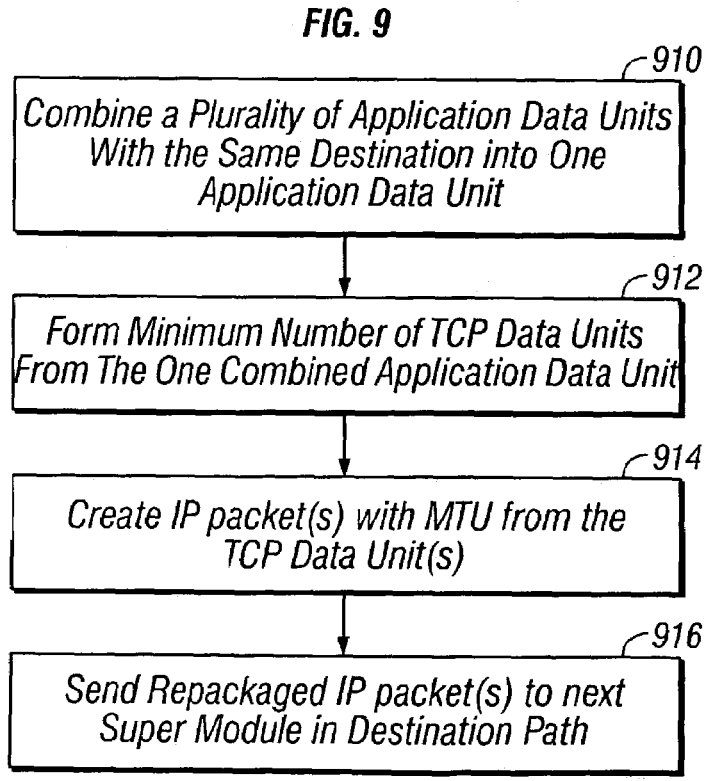
FIG. 10A is a flowchart for repackaging a plurality of application data units at a Super User of an embodiment of the present invention.

FIG. 10A is a flowchart for repackaging a plurality of application data units at a Super User of an embodiment of the present invention. At step 910 a Super User combines a plurality of application data units with the same destination into one application data unit. For example, multiple user requests to a web server, are combined. At step 912 one TCP data unit (or a minimum number of TCP data units) is formed from the one application data unit. At step 914 one IP packet (or the minimum number of IP packets), i.e., courier packet(s), are created, where each IP packet is filled to be as close as possible to the MTU number of bytes for the link or until a forwarding timer T has expired. At step 916 the courier packet(s) are sent to the next Super Module, e.g., the Super Appliance or Super CO Server, in the destination path.

Figure 10B:
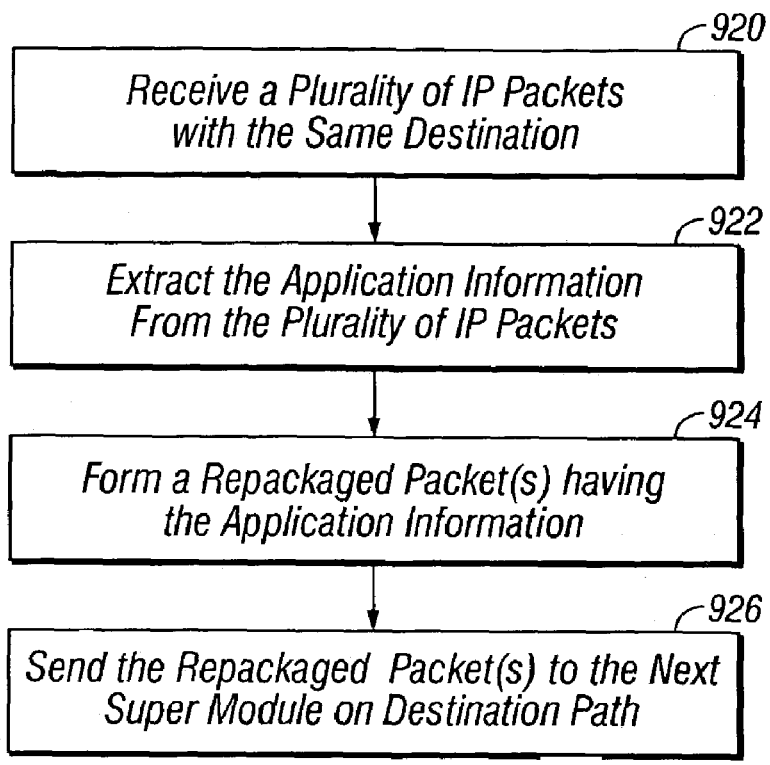
FIG. 10B is a flowchart for repackaging a plurality of received IP packets at a Super Module of another embodiment of the present invention.

FIG. 10B is a flowchart for repackaging a plurality of received IP packets at a Super Module of another embodiment of the present invention. At step 920 the Super Module receives a plurality of IP packets with the same destination. At step 922 the application information is extracted from the plurality of IP packets. At step 924 the extracted application is used to form a repackaged packet(s) (i.e., a courier packet(s)). At step 924 the repackaged packet(s) is sent on its way to the next Super Module in the path to the common destination.

Figure 10C:
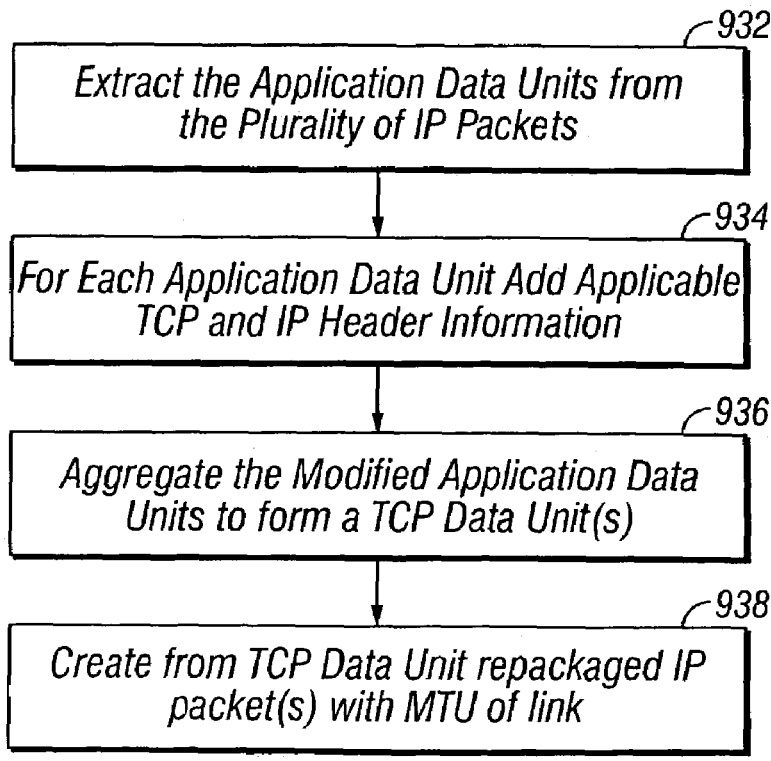
FIG. 10C explains in more detail steps of FIG. 10B.

FIG. 10C explains in more detail steps 922 and 924 of FIG. 10B. At step 932 the application data units are extracted from the IP packets. For each application data unit the related TCP header and IP header control information is examined. And the applicable control information, e.g., the source, source and destination ports, and data length, are added to the corresponding application data unit to form a modified application data unit (step 934). At step 936 the modified application data units are aggregated to form one TCP data unit (or a minimum number of TCP data units). At step 938 new repackaged IP packet(s) is formed from the TCP data unit using the MTU of the link between the sender and receiver Super Modules.

The decision on whether to form at step 936 one large TCP data unit or multiple small TCP data units is dynamically determined depending on the traffic load on the link leaving the sender Super Module. For example, if the link is near capacity then it is more efficient to send multiple small TCP data units, and hence small IP packets, then one (or several) large IP packets, which would have to wait.

Figure 11:
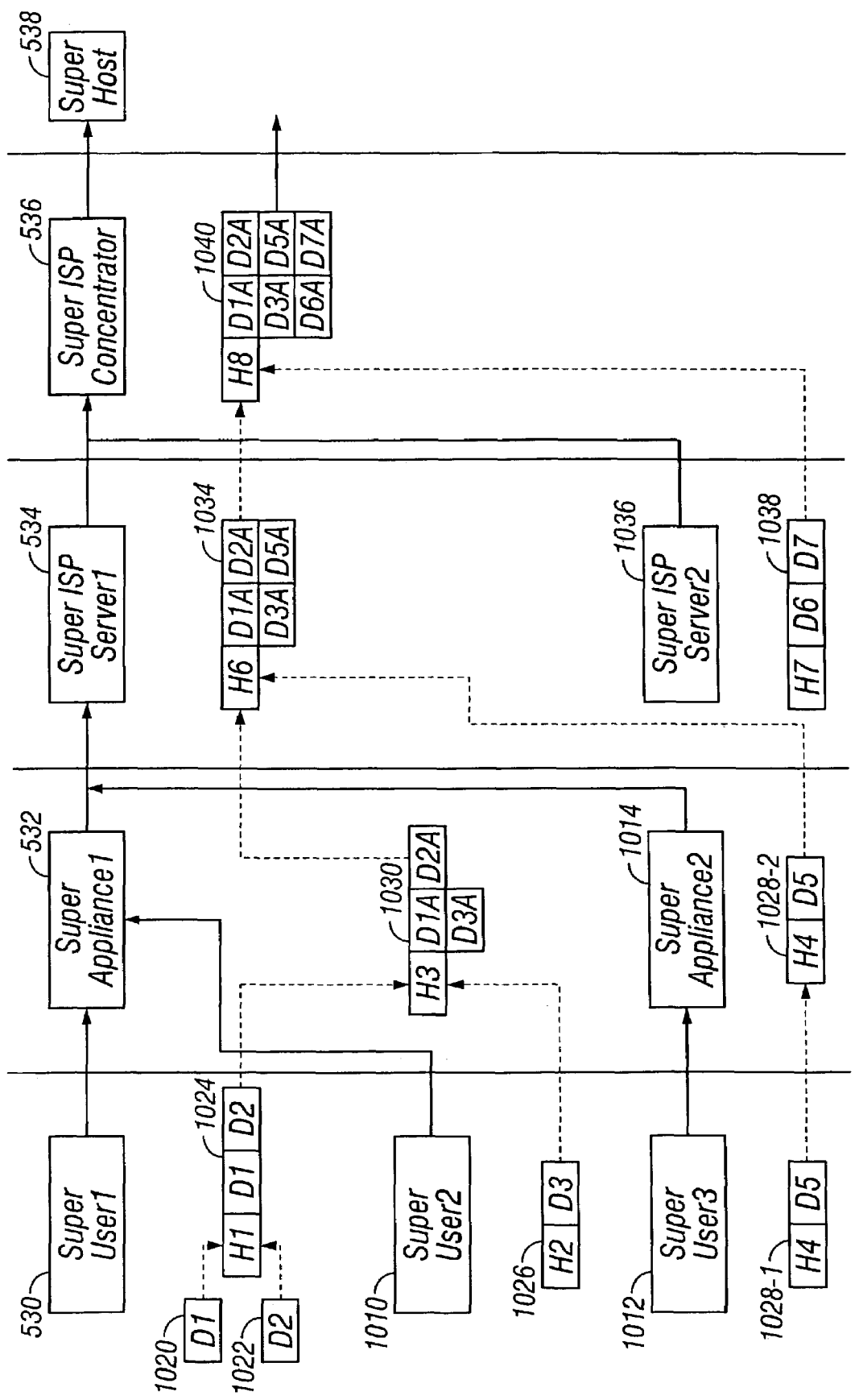
FIG. 11 shows an example of courier packets from a Super User to a Super Host of an aspect of the present invention.
Figures 1, 11:
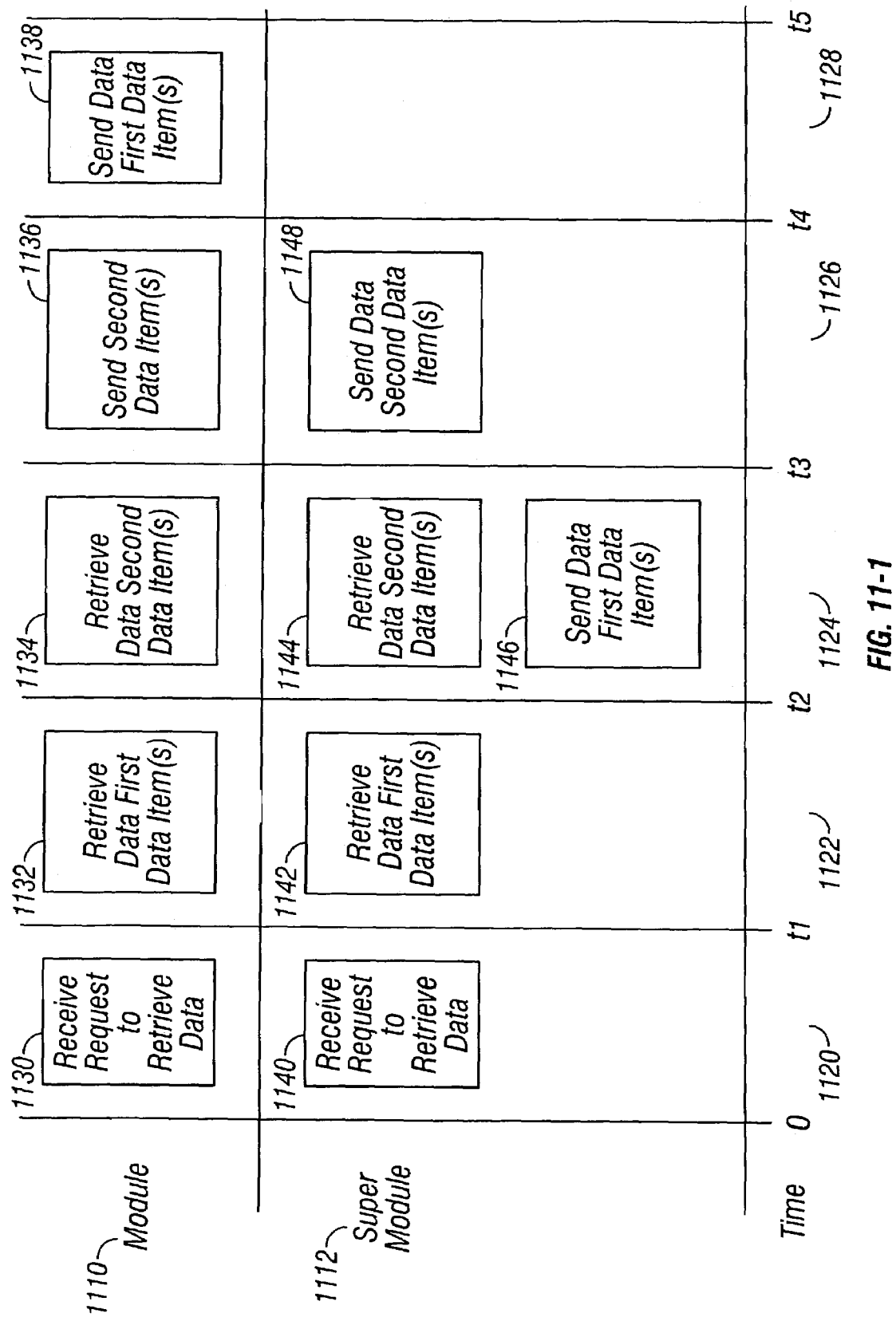

FIG. 11 shows an example of courier packets from a Super User to a Super Host of an aspect of the present invention. Super User 530 combines user requests 1020 and 1022, i.e., application data units D1 and D2, into a courier packet 1024 according to the flowchart in FIG. 10A. Super User 1010 has its user request D3 in IP packet 1026 and Super User 1012 has a user request D5 in IP packet 1028. Both of these single Super User requests are repackaged to courier packets and sent to the appropriate Super Appliance. At the first Super Appliance 530, courier packet 1024 and IP packet 1026 are received and repackaged according to the flowchart in FIG. 10B to form larger appliance courier packet 1030. Appliance courier packet 1030 has, for example, application data unit D1 which has been modified (D1A) to include control information from TCP and IP header H1 of IP packet 1024. The second Super Appliance 1014 receives courier packet 1028-1, does not change it (1028-2) and forwards it to Super CO Server 534. The Super CO Server 534 receives appliance courier packet 1030 from Super Appliance 532 and courier packet 1028-2 from Super Appliance 1014. Courier packets 1030 and 1028-2 are repackaged according to the flowchart in FIG. 10B to form CO courier packet 1034, which is sent to Super CO Concentrator 536. Super CO Server 1036 has CO courier packet 1038 which is also sent to Super CO Concentrator 536. Super CO Concentrator 536 repackages CO courier packets 1034 and 1038 to CO concentrator courier packet 1040, which is sent to Super Host 538. The Super Host unpacks CO concentrator courier packet 1040 to get user requests D1, D2, D3, D4, D5, D6, and D7 (e.g., HTTP or FTP requests) and the requests are sent to the Web server. The repackaging according to FIGS. 10A, B and C also occurs for the data responses from the web server to the Super Host 538 back to Super User 530 via Super CO Concentrator 536, Super CO Server 534, and Super Appliance 532.

In both directions, as each Super Module receives courier packets they are examined, unpacked, and the data used to update that Super Module's cache. As the courier packets are bundled and unbundled, implosions of data requests and explosions of data responses are performed.

Data Request and Data Transfer Parallelism

In the example of the user requesting a Web page, the conventional behavior for a browser is to fetch the base HTML document, and then using the base HTML document, the browser does a subsequent fetch of the many embedded objects, which are typically located on one or more web servers. The embedded objects could be put in one large TCP data unit and returned to the browser. An improvement would have the web server get both the base HTML document and the embedded objects and return both in one large TCP data unit. This means that the web server serially retrieves the base HTML document and the embedded objects and then sends both to the browser. A further embodiment of the present invention parallelizes this serial process, i.e., the retrieving and sending, by first getting the base HTML document and sending the base document to the browser. While the base HTML document is in transit, the web server retrieves the embedded objects. Then the embedded objects are sent. Hence the time to send the base HTML document is saved over the serial process. The user gets the whole web page in a shorter amount of time using this parallel process.

FIG. 11-1 illustrates an example of performing data retrieval and transfer in parallel of an aspect of the present invention. FIG. 11-1 shows two modules, the conventional module 1110 and the Super Module 1112. The horizontal axis 1114 represents time intervals 1120 (between time 0 and t1), 1122 (between times t1 and t2), 1124 (between times t2 and t3),1126 (between times t3 and t4),and 1128 (between times t4 and t5). At time interval 1120 both modules 1110 and 1112 receive a request to retrieve data (1130 and 1140).

At time interval 1122 both modules 1110 and 1112 retrieve the first data item (s) (1132 and 1142). At time interval 1124 modules 1110 and 1112 diverge in their operation with module 1110 retrieving the second data item(s) 1134, followed at time interval 1126 by sending the first data item 1136 and at time interval 1128 sending the second data item 1138 (i.e., a serial process). Super Module 1112, on the other hand, at time interval 1124, concurrently retrieves the second data item(s) 1144, while the first data item(s) is being sent 1146. At time interval 1126 the Super Module sends the second data items 1148. Thus the Super Module has a time savings of time interval 1128. As FIG. 11-1 illustrates the beginning of pipelining the retrieving and sending of data, even more time is saved when this pipeline is full.

Implosion/Explosion

Because there are many users requesting data from a finite number of web sites, the probability that requests for data are replicated for multiple users increases the closer one gets to the web servers. These duplicate requests are unnecessary network traffic and should be combined. An embodiment of the present invention implodes these duplicate requests, i.e., prunes the duplicate requests into one request, and explodes the responses, i.e., duplicates one response into several copies, at each Super Module.

Figure 12:
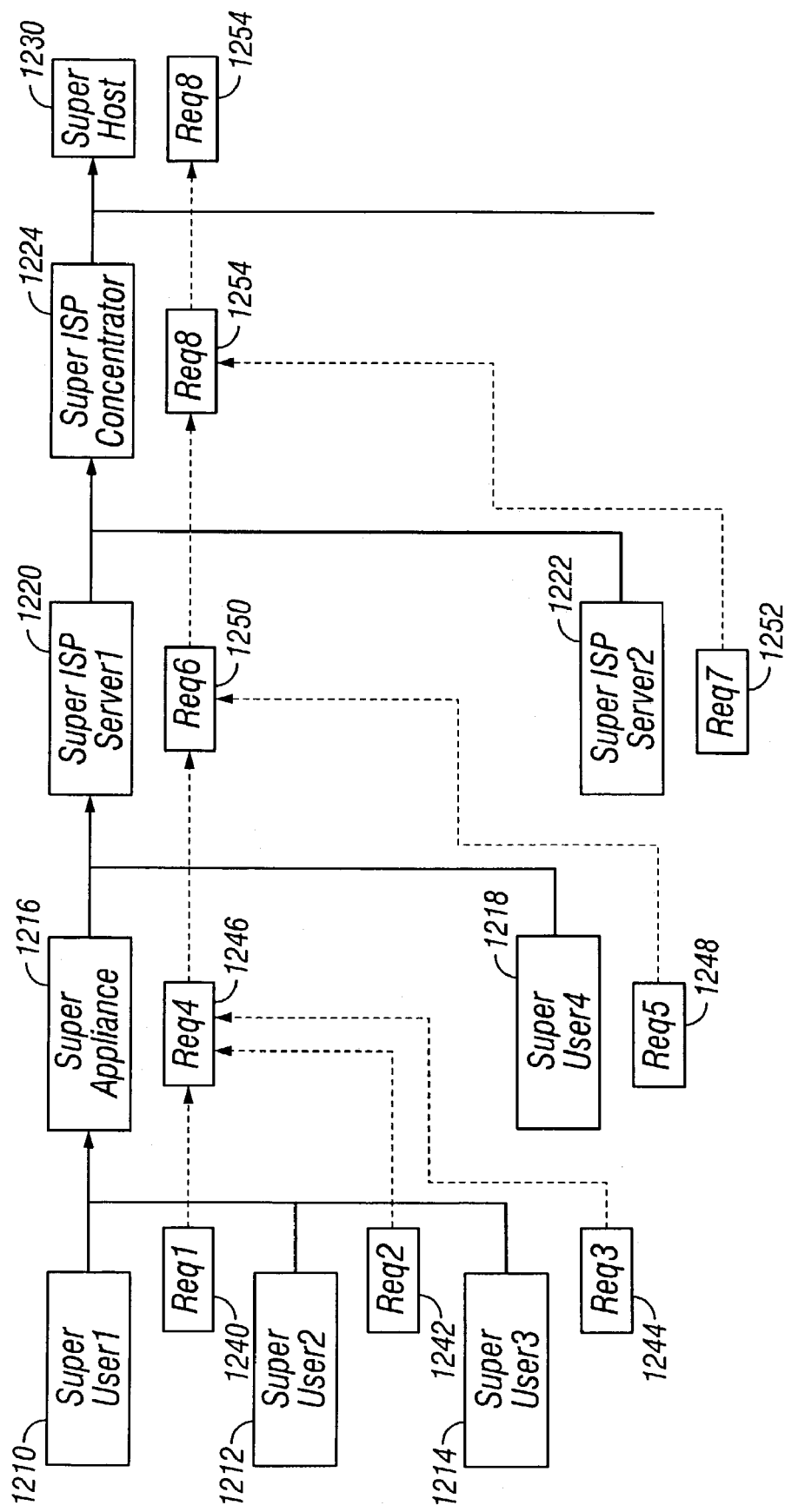
FIG. 12 shows an example of imploding data requests from Super Users to a Super Host.

FIG. 12 shows an example of imploding data requests from Super Users to a Super Host. Lets consider a stock trading company. When a hot stock arises four brokers ask for the stock quote at the same time, three brokers, i.e., Super User 1210, 1212, and 1214, sends their requests, i.e., 1240, 1242, and 1244 to the Super Appliance 1216, the Super Appliance 1216 stores the IP addresses of the requesting Super Users 1210, 1212, and 1214 and sends only one request, i.e., Req4 1246, to Super CO Server 1220. Super CO Server 1220 receives the single request 1246 and checks if there are any other duplicate requests from other Super Appliances 532 or other single Super Users not using a Super Appliance. In this example, the fourth broker, Super User 1218 has sent duplicate request 1248 to Super CO Server 1220. Super CO Server 1220 then stores the IP addresses for all duplicate requests of the Super Appliance 1216 and Super User 1218 and implodes the duplicates into a single request, i.e., 1250, and sends the request 1250 to the Super CO Concentrator 1224. The Super CO Concentrator 1224 then checks for other duplicate requests from other Super CO Servers, i.e., request 1252 from ISP server 1222, stores the IP addresses for all duplicate requesters, and sends one request 1254 the request to the Super Host 1230. The Super Host 1230 will also check and imploded an duplicate requests from other Super CO Concentrators, if applicable. In this example, there are no other Super CO Concentrators and the Super Host receives 1230 request 1254.

While the explosion process is not shown on FIG. 12, it follows the implosion process but in reverse order, starting with the Super Host 1230. The Super Host 1230 retrieves the response data, e.g., a web page, from the Web server (not shown) and explodes it (replicates it) for each of the Super CO Concentrators that requested it. The Super CO Concentrator 1224 receives the response data and explodes it for all the Super CO Servers that requested it, i.e., Super CO Server 1220 and 1222. The Super CO Server, e.g., 1220, receives the response data and explodes it for the Super Appliance 1216 and Super User 1218. The Super Appliance 1216 receives the response data and explodes it for the Super Users 1210, 1212, and 1214, that requested the data.

Figure 13A:
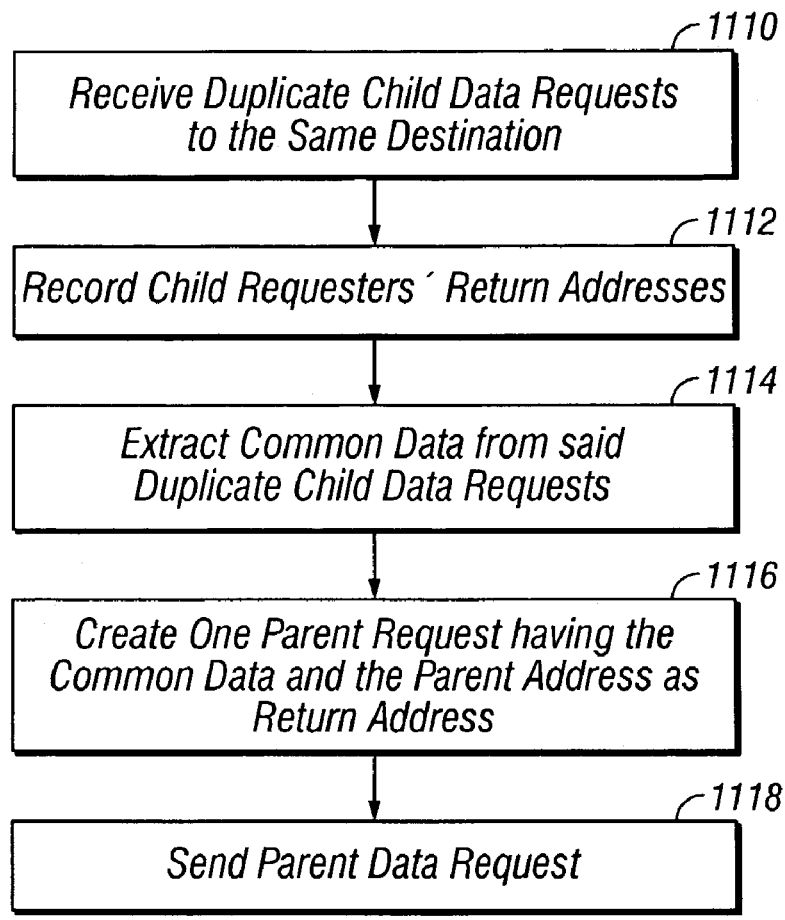
FIG. 13A is a flowchart of the process of imploding duplicate data requests to the same destination of the embodiment of the present invention.

FIG. 13A is a flowchart of the process of imploding duplicate data requests to the same destination of the embodiment of the present invention. At step 1110 duplicate child data requests to same destination are received by the parent Super Module. At step 1112, the child requester's returned addresses are recorded in a list and stored in the parent system. At step 1114 the common data from the duplicate child data requests are extracted, i.e., since all the data (not including the control information) is the same, only the data in one child data request is examined. At step 1116 one parent request having the common data and parent return address is created. And at step 1118 the parent data request is sent to the next Super Module on the path to the common destination.

Figure 13B:
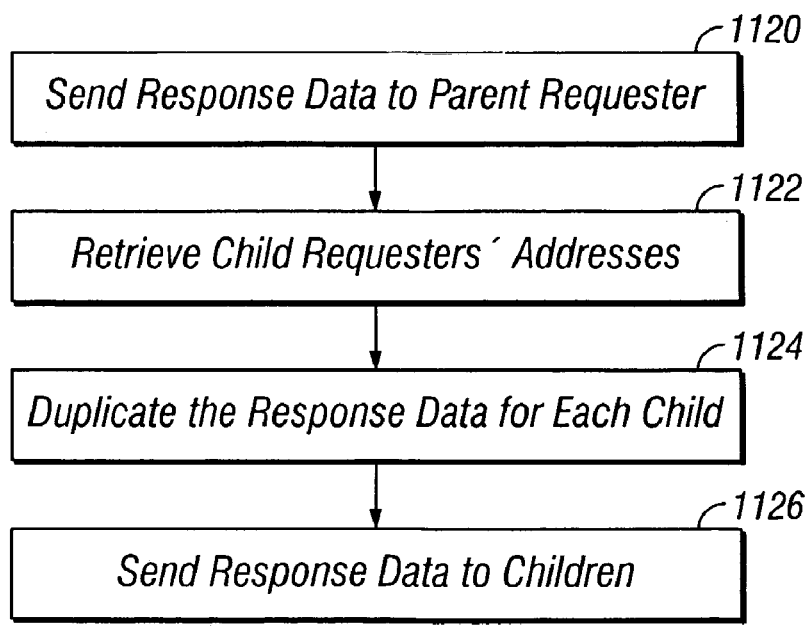
FIG. 13B shows the process of exploding the response to an imploded request of the embodiment of the present invention.

FIG. 13B shows the process of exploding the response to an imploded request of the embodiment of the present invention. At step 1120 the destination sends the response data to the parent requester, i.e., the last Super Module that sent the imploded data request. At step 1122 the parent Super Module retrieves the list having the child requesters address. At step 1124 and the response data is replicated and a copy sent to each of the children on the list (step 1126).

The implosion and explosion of data is particularly valuable for streaming audio and/or video (especially for broadcasting). When more than one user requests the same TV, video, radio or music the requests are imploded and the transmissions are exploded. The amount of bandwidth saved especially for real time broadcasting is substantial. If many people are listening to an Internet radio station, the requests are imploded as they approach the web hosting server and exploded as the travel back to the users. Since the Internet radio station is broadcasting identical data that is synchronized in time the implosion may be about 100% at the Super Host (all requests implode to one request at the Super Host) and the explosion may be about 100% (all users are served by one stream to the Super Host from the web server).

Repackaging and Implosion/Explosion

The packet repackaging methods work in combination with the implosion/explosion methods to significantly increase the information flow. One embodiment of the process of a Super User 530 requesting web page content from a Web server 182 is:

1. The Super User 530 packages all its data requests that it cannot satisfy from its local cache into a single courier packet and sends it to the Super Appliance 532.
2. The Super Appliance 532 takes all concurrent requests from other Super Users to the same destination, i.e., courier packets from other users, and repackages them into one larger appliance courier packet. Any duplicate user requests are imploded. The one appliance courier packet is sent to the Super CO Server 534.
3. The Super CO Server 532 takes all the appliance courier packets with the same destination the from the multiple Super Appliances (and any Super Users who are directly connected) and sends a larger CO courier packet to the Super CO Concentrator 536. Again duplicate user requests are imploded.
4. The Super CO Concentrator 536 repackages the concurrent CO courier packets, implodes any duplicate requests, and sends a larger CO Concentrator courier packet to the appropriate Super Host 538.
5. The Super Host 538 receives and un-packages the CO concentrator courier packet. The Super Host converts the requests into standard HTTP requests for standard web server processing.

The Web server 182 then processes the HTTP requests and produces HTTP responses, which are sent to the Super Host 538. The response processing includes:

6. The Super Host 538 receives the data responses back from the Web server 182 and the Super Host 538 updates its cache and packages the responses into a return CO concentrator courier packet, which it sends to the requesting Super CO Concentrator 536.

7. The Super CO Concentrator 536 receives the return CO concentrator courier packet and un-packages it to update the Super CO Concentrator 536 cache. The Super CO Concentrator 536 explodes the data and repackages the data into return CO courier packets and sends them to the appropriate requesting Super CO Server, e.g., 534.

8. The Super CO Server 534 receives the return CO courier packet and un-packages it, explodes the data for the Super Appliances, updates the Super CO Server's cache, repackages the data into return appliance courier packets, and sends the return appliance courier packets to the appropriate requesting Super Appliance, e.g., 532.

9. The Super Appliance 532 unpacks the return appliance courier packet updates the Super Appliance 532 cache, explodes the data, repackages the data into return user courier packets and sends the packets to the appropriate requesting Super Users, e.g. 530.

10. The Super User 530 receives the return user courier packet and unpacks it, updates its cache and passes the data to the browser 512 using the standard HTTP protocol.

Repackaging changes the efficiency of caching by storing web page data in one or more efficient blocks. This significantly reduces disk accesses by reducing the number of disk seeks.

Semi-Permanent TCP/IP Connection

Under HTTP 1.0 for every browser request and Web page response, there is a new TCP/IP virtual circuit established. This causes substantial delay, as there are many request/response pairs when a user is viewing a web site, and each virtual circuit requires a three-way handshake to establish the virtual circuit and a two or three way handshake to disconnect the virtual circuit. HTTP 1.1 provides reduced delay by establishing a persistent connection between the Web server and the HTTP 1.1 compliant browser. Hence, multiple requests can be sent in one TCP data unit and multiple responses received in one response TCP data unit. However, there are still some problems with HTTP 1.1. First, if a browser receives data from a second web server within an individual web page, then either the persistent connection to the first web server is lost or another persistent connection must be established. Second multiple users to the same web site cannot use the same persistent connection. Third the HTTP persistent connection is for Web content only and other application layer protocols, e.g., FTP, are not covered. And fourth, the persistent connection is for the whole path, not for parts of the path between the Web server and browser.

An embodiment of the present invention creates a semi-permanent TCP virtual circuit between any two Super Modules, e.g., the Super Appliance or Super User and the Super CO Server (the last mile), that lasts for either a predetermined time interval "T" or until one of the Super Modules is shut down. The semi-permanent TCP virtual circuit is established by a typical three-way TCP/IP handshake and disconnected by a typical two-way or three-way TCP/IP handshake. During the data transfer period, application data of all types, e.g., HTTP, FTP, or SMNP, and from different end sources to a common end destination, e.g., multiple users to a Web server or multiple Web servers to a user, may be transferred over this virtual circuit.

The reason that there is no limitation on the type of data or the sources of the data is because of use of courier packets. A courier packet received (or created) at the sender Super Module has an aggregation of all request or response application data units to the same destination in a large application data unit, where each request or response application data unit has a pseudo header with relevant control data, such as source address, source and destination TCP ports, etc. At the receiver Super Module, if necessary, e.g., the end user is not a Super User, the large application data unit containing the pseudo headers can be unbundled into separate TCP data units and IP packets and forwarded to the common destination. In effect the application layer has hidden the protocol and source differences from the lower three layers and the data transfer period is the transfer of a very big application data unit.

Figures 14A, 14B:
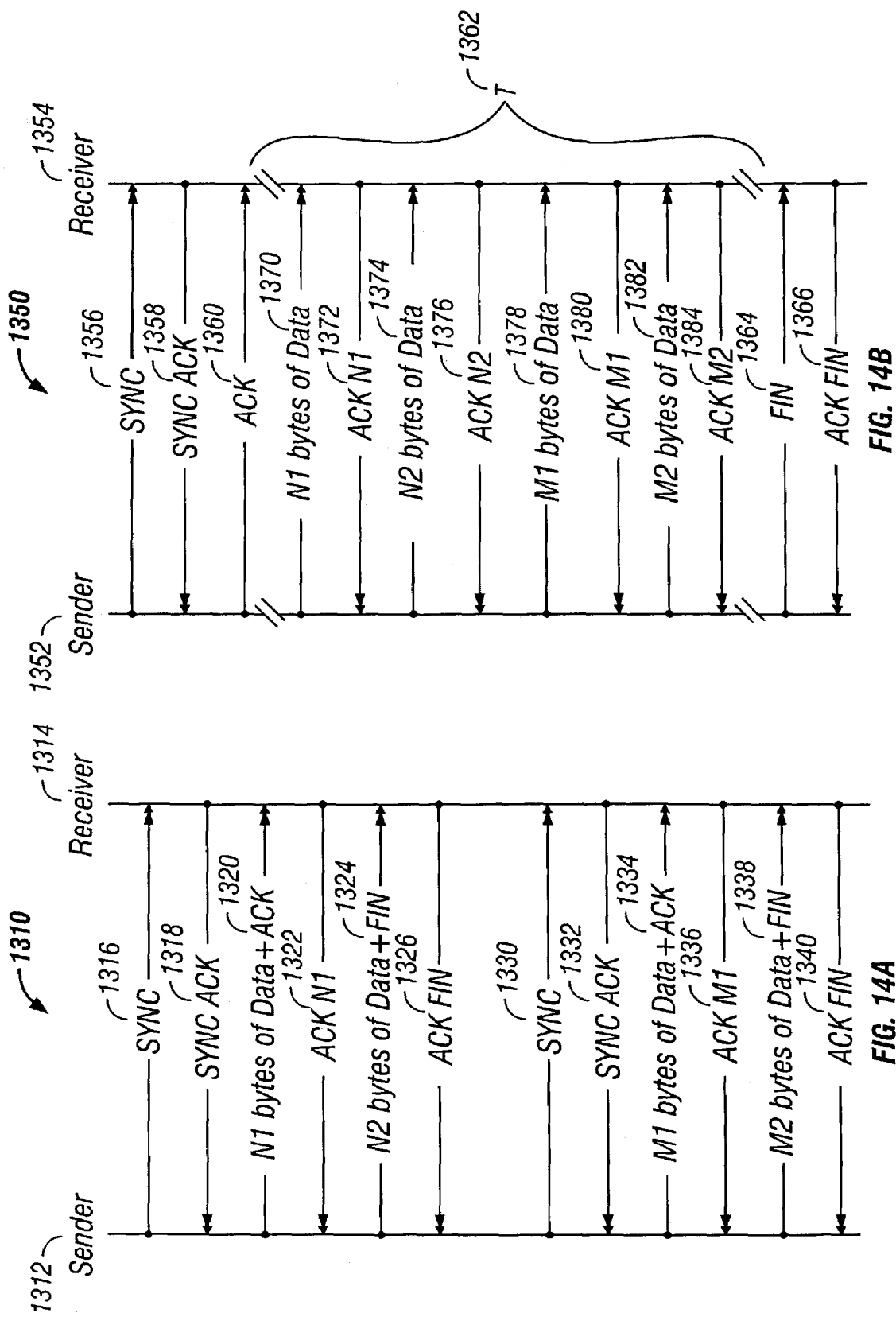
FIG. 14A shows a conventional TCP/IP connection, data transfer, and disconnection between a sender and a receiver at the transport layer.
FIG. 14B shows a TCP/IP connection, the data transfer, and disconnection for a semi-permanent connection of an embodiment of the present invention.

FIG. 14A shows a conventional TCP/IP connection, data transfer, and disconnection between a sender and a receiver at the transport layer. To establish a virtual circuit between sender 1312 and receiver 1314, a TCP sync data unit, SYNC 1316 is sent from sender 1312 to receiver 1314. Receiver 1314 returns an acknowledgment SYNC ACK 1318. Sender 1312 sends both N1 bytes of data 1320 as the first TCP data unit for an application data unit of size N1+N2, and an acknowledgment ACK of SYNC ACK 1318 to complete the three-way connection handshake. Receiver 1314 returns an acknowledgment ACK N1 1322. Sender 1312 then sends N2 bytes of data 1324 and sets the final flag (FIN) in the second TPC data unit indicating the transfer of data is complete. Receiver 1314 returns an acknowledgment ACK FIN 1326 to acknowledge the transfer of data and close the virtual circuit connection. When sender 1312 wants to send another application data unit of M1+M2 bytes, a new virtual circuit has to be set up by SYNC 1330, SYNC ACK 1332 and the ACK in 1334. Sender 1312 sends the first TCP data unit with M1 bytes of data 1334 and receiver 1314 returns an acknowledgment 1336. Sender 1312 sends a second TCP data unit with M2 bytes of data 1338 and the FIN bit set. Receiver 1314 acknowledges the final bit with ACK FIN 1340 and closes the virtual circuit connection.

FIG. 14B shows a TCP/IP connection, the data transfer, and disconnection for a semi-permanent connection of an embodiment of the present invention. Sender 1352 sets up an initial virtual circuit connection by sending SYNC 1356 to receiver 1354. Receiver 1354 acknowledges with a SYNC ACK 1358, which is further acknowledged by sender 1352 by ACK 1360. This completes the initial three-way handshake to set up the persistent virtual TCP/IP connection. After a predetermined time interval "T" 1362, a TCP data unit with a set FIN bit 1364 is sent by sender 1352 requesting the closing of the virtual circuit connection. Receiver 1354 responds with ACK FIN 1366 and closes the virtual circuit. In the predetermined time T 1362 the TCP data units having N1, N2, M1, and M2 bytes are transferred. From sender 1352 and N1 bytes of data 1370 are transferred to receiver 1354 and receiver 1354 responds with ACK N1 1372. Next N2 bytes 1374 are transferred to receiver 1354 which responds with ACK N2 1376. Then M1 bytes of data 1378 are transferred to receiver 1354 which responds with ACK M1 1380. And lastly, M2 bytes of data 1382 are transferred to receiver 1354, which responds with ACK M2 1384. Thus during time interval T one large application data unit of N1+N2+M1+M2 bytes broken into four TCP data units has been transferred from the sender 1352 to the receiver 1354. If more application data needs to be transferred then the new application data units are appended on to the one large application data unit of N1+N2+M1+M2 bytes and sent over the semi-permanent connection.

VPN

A Virtual Private Network (VPN) is private network, such as a corporate intra-net, that uses the resources of a public network, such as the Internet. Two typical types of VPNs are site-to-site and remote access. Each type makes use of a VPN gateway, which is a gatekeeper, typically specialized hardware, between a trusted private network and the untrusted public network. The gatekeeper has a "guest" list of who has access to the trusted private network. If a packet is not on the list then there is no access.

Figure 15:
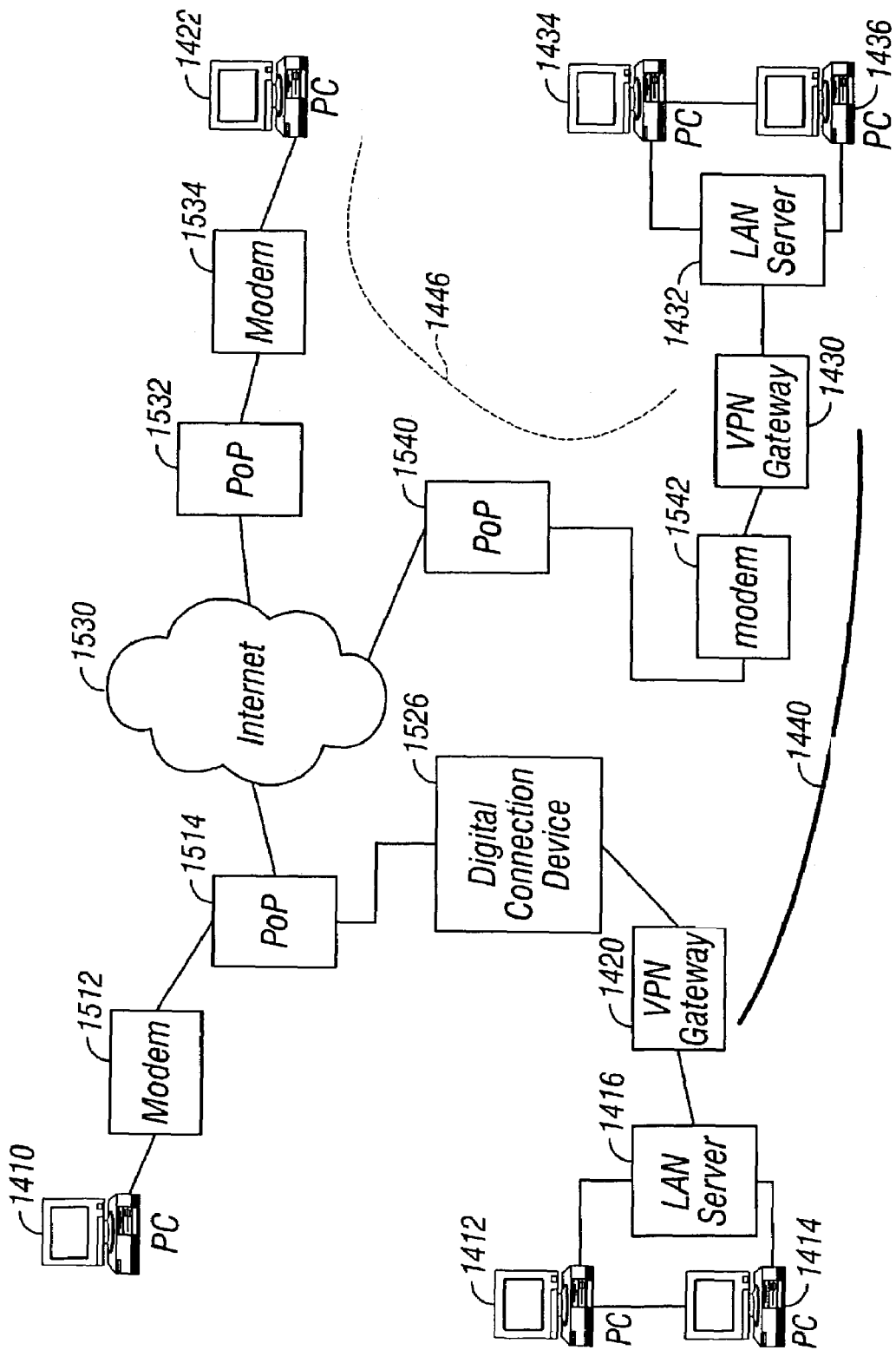
FIG. 15 shows examples of a conventional site-to-site VPN 1440 and a conventional remote VPN 1446.

FIG. 15 shows examples of a conventional site-to-site VPN 1440 and a conventional remote VPN 1446. For a site-to-site VPN 1440, a first intranet, having PC 1412, PC 1414, and LAN server 1416, is connected by VPN gateway 1420 to the Internet 1530 by digital connection device 1526 and PoP 1514. From internet 1530 the VPN 1440 is connected to a second intranet, having PC 1434, PC 1436, and LAN server 1432, via PoP 1540, modem 1542, and VPN gateway 1430. Hence the first intranet and the second intranet are connected together via the Internet to form a combined intranet. For a remote VPN 1446, a user at a remote PC dials in via modem 1534 to PoP 1532 to access LAN server 1432 via Internet 1530, PoP 1540, modem 1542, and VPN Gateway 1430. The PC will have VPN client software and may have a fixed IP address or a dynamic IP address supplied by a dynamic DNS/URL service, which supplies a URL (uniform resource locator) to be used by the PC. The dynamic DNS/URL service informs the VPN gateway 1430 of the PC's IP address, so that PC has access to LAN server 1432.

Figure 16:
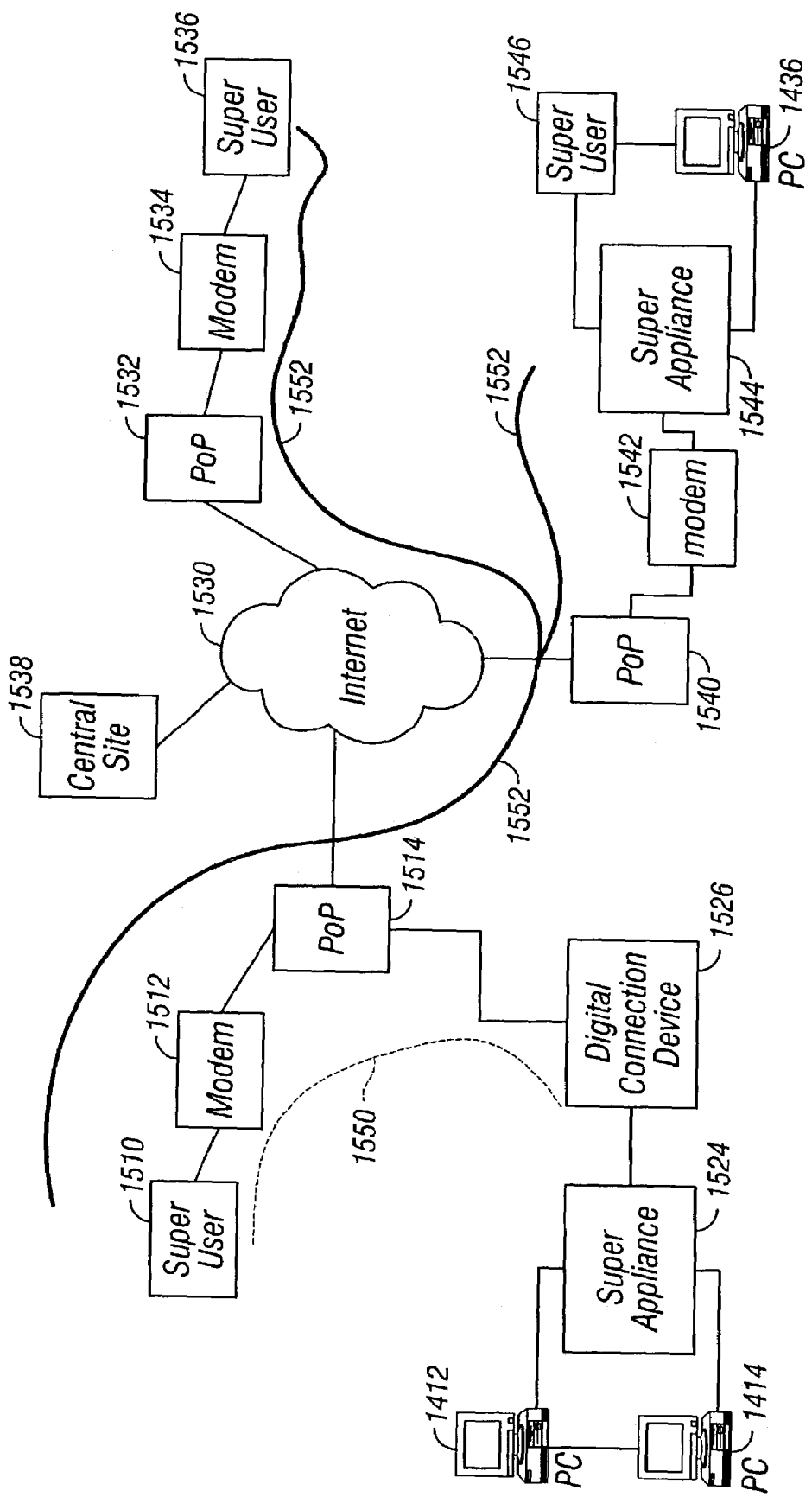
FIG. 16 shows examples of two virtual private networks (VPNs) of an embodiment of the present invention.

The conventional VPNs as illustrated in FIG. 16 have several limitations. First, special gateway hardware is typically required. And second, a user cannot have access to multiple VPNs. An embodiment of present invention overcomes these problems. Any grouping of Super Module sites can form one or more VPNs. There is a Central Site 1538 (FIG. 16) which has a permission table of which Super Module has access to which other Super Module, i.e., who can access whom.

FIG. 16 shows examples of two virtual private networks (VPNs) of an embodiment of the present invention. Super User 1510 belongs to VPN 1552 and to VPN 1550. Super User 1510 is remotely connected to Super Appliance 1524 via remote VPN 1550, where Super Appliance 1524 is a software gateway executing on LAN server1416. When Super Appliance 1524 and Super Appliance 1544 start up, they send their IP addresses to the permission table at the Central Site 1538. The Super User 1510 dials into PoP 1514 via modem 1512 and the PoP assigns an IP address to the Super User. Next, the Central Site is logged into by Super User 1510 and the Super User 1510 reports its IP address to the Central Site. When Super User 1510 wants to access PC 1412 via Super Appliance 1524, the permission table is checked. Since Super user 1510 has access rights, a tunnel, i.e., VPN 1550, between the Super User 1510 IP address and the Super Appliance 1524 IP address is established. Super User 1510 also has access to Super User 1536 and Super Appliance 1544 as indicated by the permissions table at the Central Site 1538, hence VPN 1552 is established. Thus a Super User has access to multiple VPNs and to other Super Users.

In alternative embodiment, Super User 1536 may also be a remote user and may not be logged on, when VPN 1552 is created. When Super User 1536 logs in, it is assigned an IP address and according to the permission table, a three way VPN including, Super User 1536, Super User 1510 and Super Appliance 1544, is established.

The optimizations described above for the super transport system can be applied across any VPN of embodiments of the present invention, as long as an Super Appliance module is installed on both sides of the VPN. As an example, two Super Modules can be connected using a VPN and all data transfers, whether they are files, email or web pages, use, for example, the compression techniques, courier packets, persistent TCP/IP, implosion/explosion, and/or efficient file formats described above.

Conclusion

Although specific embodiments of the invention have been described, various modifications, alterations, alternative constructions, and equivalents are also encompassed within the scope of the invention. The described invention is not restricted to operation within certain specific data processing environments, but is free to operate within a plurality of data processing environments. Additionally, although the invention has been described using a particular series of transactions and steps, it should be apparent to those skilled in the art that the scope of the invention is not limited to the described series of transactions and steps.

Further, while the invention has been described using a particular combination of hardware and software, it should be recognized that other combinations of hardware and software are also within the scope of the invention. The invention may be implemented only in hardware or only in software or using combinations thereof.

The specification and drawings are, accordingly, to be regarded in an illustrative rather than a restrictive sense. It will, however, be evident that additions, subtractions, deletions, and other modifications and changes may be made thereunto without departing from the broader spirit and scope of the invention as set forth in the claims.

What is claimed is:

1. A method for compressing data by a first computer system for transfer to a second computer system via a communications network, said method comprising:
    selecting a section of data by said first computer system;
    determining a cost value for each compression algorithm of a plurality of compression algorithms based on a plurality of system operating conditions associated with said first computer system;
    selecting a compression algorithm from said plurality based on a smallest cost value; compressing said section using said selected compression algorithm, and sending said compressed section of data to said second computer system.

2. The method of claim 1 wherein said cost value comprises a sum of a time to compress said section plus a time to transfer said compressed section to said second computer.

3. The method of claim 1 wherein said first computers system operating conditions includes available processing cycles of said first computer system.

4. A method for compressing data by a first computer system for transfer to a second computer system via a communications network, comprising:
    selecting a section of data by said first computer system;
    determining a data format of said section;
    compressing said section using a compression algorithm, said compression algorithm automatically selected from a plurality of compression algorithms each comprising a cost value, wherein said compression algorithm is selected based on said data format and said cost value; and
    sending said compressed section to said second computer.

5. The method of claim 4 wherein said data format comprises a selection from a group consisting of image, binary, text, flash, graphics, video, audio, and word processing formats.

6. The method of claim 4 further comprising storing said section of data in a file format corresponding to a reduced file size compared to other file formats.

7. A method of transferring application data via a communications network, the method comprising:

establishing a first Virtual Private Network of a plurality of Virtual Private Networks between a first computer of a plurality of computers and a second computer of said plurality of computers by using a centralized permission table comprising said first computer's address and said second computer's address, wherein said plurality of Virtual Private Networks is provided by said plurality of computers connected together by a public communications network;

establishing a second Virtual Private Network of said plurality of Virtual Private Networks between said first computer and a third computer of said plurality of computers by using said centralized permission table further comprising said third computer's address;

establishing a TCP connection between said first computer system and said second computer system;

receiving at said first computer system a plurality of packets from a plurality of source addresses, wherein said plurality of packets have a common destination, wherein each packet comprises application data;

extracting from said plurality of packets, information comprising said application data;

selecting a section of said information by said first computer system;

determining a cost value for each compression algorithm of a plurality of compression algorithms using said first computer's system operating conditions;

selecting a compression algorithm from said plurality based on a smallest cost value;

compressing said section using said selected compression algorithm;

creating a new packet comprising said compressed section;

sending said new packet to said second computer system over said TCP connection;

disconnecting said TCP connection;

receiving a request by said first computer to retrieve data from a data storage;

retrieving a first data item from said data storage by said first computer; and said first computer concurrently sending said first data item to said third computer while retrieving a second data item from said data storage.

* * * * *